(12) United States Patent
Ye et al.

(10) Patent No.: US 12,191,996 B2
(45) Date of Patent: *Jan. 7, 2025

(54) HARQ FOR ADVANCED CHANNEL CODES

(71) Applicant: INTERDIGITAL PATENT HOLDINGS, INC., Wilmington, DE (US)

(72) Inventors: Chunxuan Ye, San Diego, CA (US); Nirav B. Shah, San Diego, CA (US); Fengjun Xi, San Diego, CA (US); Kyle Jung-Lin Pan, Saint James, NY (US)

(73) Assignee: InterDigital Patent Holdings, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 18/483,202

(22) Filed: Oct. 9, 2023

(65) Prior Publication Data
US 2024/0048272 A1    Feb. 8, 2024

Related U.S. Application Data

(63) Continuation of application No. 17/713,793, filed on Apr. 5, 2022, now Pat. No. 11,784,750, which is a
(Continued)

(51) Int. Cl.
*H04L 1/00* (2006.01)
*H03M 13/00* (2006.01)
(Continued)

(52) U.S. Cl.
CPC ....... *H04L 1/0057* (2013.01); *H03M 13/1102* (2013.01); *H03M 13/116* (2013.01);
(Continued)

(58) Field of Classification Search
CPC ..... H04L 1/1812; H04L 1/1867; H04L 1/005; H04L 1/0057; H04L 1/0069;
(Continued)

(56) References Cited

U.S. PATENT DOCUMENTS 7,458,009 B2    11/2008    Yu et al.
7,954,041 B2    5/2011    Hong et al.
(Continued)

FOREIGN PATENT DOCUMENTS

CN    101188428    5/2008
EP    2 091 171    8/2009
(Continued)

OTHER PUBLICATIONS

Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073 (Jul. 2009).
(Continued)

*Primary Examiner* — Guy J Lamarre
(74) *Attorney, Agent, or Firm* — Volpe Koenig

(57) ABSTRACT

A method may comprise receiving a first signal comprising first LDPC bits including systematic bits and parity bits and transmitting information indicating that the first signal was incorrectly received. A second signal comprising second LDPC bits may be received in response to the transmitting. The second signal may include LDPC bits according to a lifting size of an LDPC base graph.

23 Claims, 23 Drawing Sheets

Related U.S. Application Data continuation of application No. 16/987,809, filed on Aug. 7, 2020, now Pat. No. 11,323,206, which is a continuation of application No. 16/324,347, filed as application No. PCT/US2017/046300 on Aug. 10, 2017, now Pat. No. 10,790,934.

(60) Provisional application No. 62/372,966, filed on Aug. 10, 2016, provisional application No. 62/416,504, filed on Nov. 2, 2016.

(51) Int. Cl.
| | |
|---|---|
| *H03M 13/11* | (2006.01) |
| *H03M 13/13* | (2006.01) |
| *H04L 1/18* | (2023.01) |
| *H04L 1/1812* | (2023.01) |
| *H04L 1/1867* | (2023.01) |

(52) U.S. Cl.
CPC ... *H03M 13/6306* (2013.01); *H03M 13/6393* (2013.01); *H04L 1/0041* (2013.01); *H04L 1/005* (2013.01); *H04L 1/0069* (2013.01); *H04L 1/1812* (2013.01); *H04L 1/1819* (2013.01); *H04L 1/1867* (2013.01); *H03M 13/13* (2013.01)

(58) Field of Classification Search
CPC ................ H04L 1/1819; H04L 1/0041; H03M 13/6306; H03M 13/6393; H03M 13/116; H03M 13/1102; H03M 13/13
See application file for complete search history.

(56) References Cited

U.S. PATENT DOCUMENTS

| | | | |
|---|---|---|---|
| 8,151,157 B2 | 4/2012 | Lee et al. | |
| 8,516,334 B2 | 8/2013 | Xu et al. | |
| 8,527,832 B2 | 9/2013 | Savin | |
| 8,578,249 B2 | 11/2013 | Khandekar et al. | |
| 8,689,083 B2 | 4/2014 | Nguyen et al. | |
| 8,892,979 B2 | 11/2014 | Richardson et al. | |
| 11,323,206 B2 * | 5/2022 | Ye .......................... | H04L 1/1819 |
| 11,784,750 B2 * | 10/2023 | Ye .......................... | H04L 1/0041 |
| | | | 714/776 |
| 2010/0192037 A1 | 7/2010 | Kuri et al. | |
| 2010/0211841 A1 | 8/2010 | Cao et al. | |
| 2015/0155884 A1 | 6/2015 | El-Khamy et al. | |
| 2019/0013901 A1 | 1/2019 | Nimbalker et al. | |

FOREIGN PATENT DOCUMENTS

| | | |
|---|---|---|
| WO | 2007/142476 | 12/2007 |
| WO | 2007/145487 | 12/2007 |
| WO | 2009/094805 | 8/2009 |

OTHER PUBLICATIONS

CATT, "Comparison of LDPC and polar codes for URLLC," TSG-RAN WG1 Meeting #88, R1-1702111, Athens, Greece (Feb. 13-17, 2017).
CATT, "Performance comparison of LDPC and polar codes for URLLC," 3GPP TSG RAN WG1 AH_NR Meeting, R1-1700243, Spokane, USA (Jan. 16-20, 2017).
Ericsson, "Channel Coding for eMBB Data," 3GPP TSG RAN WG1 Meeting #87, R1-1611319, Reno, USA, (Nov. 14-18, 2016).
Ericsson, "Performance Evaluation of Turbo Codes and LDPC Codes at Lower Code Rates," 3GPP TSG RAN WG1 Meeting #85, R1-164358, Nanjing, China (May 23-27, 2016).
Ericsson, "Rate Matching for LDPC Codes," 3GPP TSG RAN WG1 Meeting #87, R1-1611322, Reno, USA, (Nov. 14-18, 2016).
Gallager, "Low-Density Parity-Check Codes," MIT Press (1963).
Huawei et al., "Channel coding for URLLC scenario," 3GPP TSG RAN WG1 NR Ad-Hoc Meeting, R1-1700075, Spokane, USA (Jan. 16-20, 2017).
Huawei et al., "Channel coding for URLLC scenario," 3GPP TSG RAN WG1 Meeting #88, R1-1703346, Athens, Greece (Feb. 13-17, 2017).
Huawei et al., "Clarification on IF-HARQ for PC-Polar," 3GPP TSG-RAN WG1 #86bis, R1-1610687, Lisbon, Portugal (Oct. 10-14, 2016).
Huawei et al., "Evaluation of LDPC performance," 3GPP TSG RAN WG1 Meeting #86bis, R1-1608866, Lisbon, Portugal (Oct. 10-14, 2016).
Huawei et al., "HARQ scheme for polar codes," 3GPP TSG RAN WG1 Meeting #87, R1-1611255, Reno, USA, (Nov. 14-18, 2016).
Huawei et al., "HARQ scheme for polar codes," 3GPP TSG RAN WG1 Meeting #86, Gothenburg, Sweden (Aug. 22-26, 2016).
IEEE Standard for Information technology—Telecommunications and information exchange between systems—Local and metropolitan area networks—Specific requirements; Part 11: Wireless LAN Medium Access Control (MAC) and Physical Layer (PHY) Specifications, IEEE Std. 802.11-2012 (Mar. 29, 2012).
IEEE Standard for Information technology—Telecommunications and information exchange between systems—Local and metropolitan area networks—Specific requirements; Part 11: Wireless LAN Medium Access Control (MAC) and Physical Layer (PHY) Specifications, IEEE Std. 802.11-2016 (Dec. 7, 2016).
Intel Corporation, "Data channel encoding chain," 3GPP TSG RAN WG1 Meeting #88, R1-1702711, Athens, Greece (Feb. 13-17, 2017).
Intel Corporation, "Data channel encoding chain," 3GPP TSG RAN WG1 Ad hoc, R1-1700382, Spokane, USA (Jan. 16-20, 2017).
Intel Corporation, "LDPC HARQ design," 3GPP TSG RAN WG1 Ad hoc, R1-1700384, Spokane, USA (Jan. 16-20, 2017).
Interdigital Communications, "On URLLC Channel Codes," 3GPP TSG RAN WG1 Meeting #88, R1-1702356, Athens, Greece (Feb. 13-17, 2017).
Interdigital Communications, "Performance Evaluation of URLLC Channel Codes," 3GPP TSG RAN WG1 NR Ad-Hoc Meeting, R1-1700725, Spokane, USA (Jan. 16-20, 2017).
Kim et al., "Design of Incremental Redundancy Hybrid-ARQ with Rate Compatible LDPC Codes," International Journal of Control and Automation, vol. 6, No. 4 (Aug. 2013).
LG Electronics, "Considerations on channel coding chain for eMBB," 3GPP TSG RAN WG1 Meeting #87, R1-1611855, Reno, USA, (Nov. 14-18, 2016).
LG Electronics, "LDPC Codes supporting HARQ IR with low complexity," 3GPP TSG RAN WG1#46, R1-062136, Tallinn, Estonia (Aug. 28-Sep. 1, 2006).
Li, "Polar Codes for 5G," Nasit, San Diego, CA (Aug. 13, 2015).
Mackay et al., "Near Shannon limit performance of low density parity check codes," Electronics Letters, vol. 32, Issue 28 (Jul. 1996).
Mediatek Inc., "eMBB Encoding Chain," 3GPP TSG-RAN WG1 NR, R1-1702732, Athens, Greece (Feb. 13-17, 2017).
Nguyen et al., "The Design of Rate-Compatible Protograph LDPC Codes," IEEE Transactions on Communications, vol. 60, No. 10, pp. 2841-2850 (Oct. 2012).
Niu et al., "Beyond turbo codes: Rate-compatible punctured polar codes," Proceedings of the IEEE International Conference on Communications (ICC), Budapest, Hungary, pp. 3423-3427 (Jun. 2013).
Niu et al., "CRC-Aided Decoding of Polar Codes," IEEE Communications Letters, vol. 16, No. 10, pp. 1668-1671, Oct. 2012.
Nokia et al., "LDPC design for eMBB data," 3GPP TSG-RAN WG1#NR Ad-Hoc meeting, R1-1701028, Spokane, USA (Jan. 16-20, 2017).
Park et al., "Proposal for IEEE 802.16m Hybrid ARQ and FEC," IEEE C802.16m-08/768 (Jul. 2008).
Qualcomm Incorporated, "LDPC Codes—HARQ, rate," 3GPP TSG-RAN WG1 #84b, R1-162209, Busan, Korea (Apr. 11-15, 2016).
Qualcomm Incorporated, "LDPC rate compatible design," 3GPP TSG-RAN WG1 NR Ad Hoc, R1-1700830, Spokane, USA (Jan. 16-20, 2017).

(56) References Cited

OTHER PUBLICATIONS

Samsung, "Flexibility of LDPC—Length, Rate and IR-HARQ," 3GPP TSG RAN WG1 #85, R1-164007, Nanjing, China (May 23-27, 2016).
Tal et al., "How to Construct Polar Codes," IEEE Transactions on Information Theory, vol. 59, No. 10 (Oct. 2013).
Tal et al., "List Decoding of Polar Codes," arXiv:1206.0050v1 [cs.IT] (May 31, 2012).
Third Generation Partnership Project, "Technical Specification Group Radio Access Network; Evolved Universal Terrestrial Radio Access (E-UTRA); Multiplexing and channel coding (Release 12)," 3GPP TS 36.212 V12.6.0 (Sep. 2015).
Third Generation Partnership Project, "Technical Specification Group Radio Access Network; Evolved Universal Terrestrial Radio Access (E-UTRA); Multiplexing and channel coding (Release 13)," 3GPP TS 36.212 V13.2.0 (Jun. 2016).
Third Generation Partnership Project, "Technical Specification Group Radio Access Network; Evolved Universal Terrestrial Radio Access (E-UTRA); Multiplexing and channel coding (Release 13)," 3GPP TS 36.212 V13.6.0 (Jun. 2017).
Third Generation Partnership Project, "Technical Specification Group Radio Access Network; Evolved Universal Terrestrial Radio Access (E-UTRA); Multiplexing and channel coding (Release 14)," 3GPP TS 36.212 V14.3.0 (Jun. 2017).
Third Generation Partnership Project, "Technical Specification Group Radio Access Network; NR; Multiplexing and channel coding (Release 15)," 3GPP TS 38.212 V0.0.0 (May 2017).
Thorpe, "Low-Density Parity-Check (LDPC) Codes Constructed from Protographs," IPN Progress Report 42-154 (Aug. 15, 2003).
Trifonov, "Design of Polar Codes for Rayleigh Fading Channel," International Symposium on Wireless Communication Systems, pp. 331-335 (Aug. 25, 2015).
Trifonov, "Efficient Design and Decoding of Polar Codes," IEEE Transactions on Communications, vol. 60, No. 11, pp. 3221-3227 (Nov. 2012).
Vangala et al., "A Comparative Study of Polar Code Constructions for the AWGN Channel," arXiv:1501.02473v1 [cs.IT] (Jan. 11, 2015).
Wang et al., "A Novel Puncturing Scheme for Polar Codes," IEEE Communications Letters, vol. 18, No. 12, pp. 2081-2084 (Dec. 2014).
Wen et al., "On the Performance of Incremental Redundancy Hybrid ARQ Schemes with Rate Compatible LDPC Codes," International Conference on Communications, Circuits and Systems (Jun. 2006).
Yue et al., "SDD Text Proposal for IEEE 802.16m Incremental Redundancy (IR) HARQ with LDPC Codes," IEEE C802.16m-08/711 (Jul. 2008).
ZTE et al., "Compact LDPC design for eMBB," 3GPP TSG RAN WG1 AH NR Meeting, R1-1700247, Spokane, USA (Jan. 16-20, 2017).
ZTE et al., "HARQ Performance of Rate-compatible Polar codes," 3GPP TSG RAN WG1 #86bis, R1-1611110, Reno, USA, (Nov. 14-18, 2016).

* cited by examiner

HARQ FOR ADVANCED CHANNEL CODES

CROSS REFERENCE TO RELATED APPLICATIONS

This application is a continuation of U.S. patent application Ser. No. 17/713,793 filed Apr. 5, 2022, which is a continuation of U.S. patent application Ser. No. 16/987,809 filed Aug. 7, 2020 which issued as U.S. Pat. No. 11,323,206 on May 3, 2022, which is a continuation of U.S. patent application Ser. No. 16/324,347 filed on Feb. 8, 2019, which issued as U.S. Pat. No. 10,790,934 on Sep. 29, 2020 which is the U.S. National Stage, under 35 U.S.C. § 371, of International Application No. PCT/US2017/046300 filed Aug. 10, 2017, which claims the benefit of U.S. provisional application No. 62/372,966 filed on Aug. 10, 2016 and U.S. provisional application No. 62/416,504 filed on Nov. 2, 2016 the contents of which are hereby incorporated by reference herein.

BACKGROUND

Polar codes were first introduced by Erdal Arikan in "Channel Polarization: A method for Constructing Capacity-Achieving Codes for Symmetric Binary-Input Memoryless Channels," IEEE Transactions on Information Theory, July 2009. Like turbo codes and low density parity check (LDPC) codes, polar codes are capacity achieving codes. Polar codes are linear block codes, with low encoding and decoding complexity, a very low error floor and explicit construction schemes.

Consider a (N,K) polar code, where K is the information block length and N is the coded block length. Here, the value N is set as a power of 2, i.e., $N=2^n$ for some integer n. A generator matrix of a polar code can be expressed by $G_N = B_N F^{\otimes n}$, where $B_N$ is the bit-reversal permutation matrix, $(\cdot)^{\otimes n}$ denotes the n-th Kronecker power and $$F = \begin{bmatrix} 1 & 0 \\ 1 & 1 \end{bmatrix}.$$

In an implementation of polar codes, the $B_N$ may be ignored at the encoder side for simplicity and the bit-reversal operation is done at the decoder side. FIG. 2 shows an implementation of $F^{\otimes 3}$. The outputs of a polar encoder are given by $x^N = u^N G_N$.

In the initial paper on polar codes, a Successive Cancellation (SC) decoding scheme was introduced. Some advanced decoding schemes were developed based on SC decoding, including Successive Cancellation List (SCL) Decoding (I. Tai and A. Vardy, "List Decoding of Polar Codes," arXiv:1206.0050v1, May 2012) and CRC-Aided SCL Decoding (K. Niu and K. Chen, "CRC-Aided Decoding of Polar Codes," IEEE Communications letters, October 2012).

Polar codes are well structured in terms of encoding and decoding. The design of a good polar code relies on the mapping of the K information bits to the N input bits $u^N$ to the polar encoder. In principle, the K information bits should be put on the K best bit channels (or the most reliable bit channels). The remaining N−K input bits, not mapped from the information bits, are called frozen bits, which are generally set as 0. The set of the positions for frozen bits is called frozen set $\mathcal{F}$.

There are multiple ways to calculate the reliability of a bit channel. For instance, Bhattacharyya bounds, Monte-Carlo estimation, full transition probability matrices estimation and Gaussian approximation are typical ways to calculate the reliabilities of bit channels. These schemes have different computation complexity and may apply to different channel conditions (H. Vangala, E. Viterbo and Y. Hong, "A Comparative Study of Polar Code Constructions for the AWGN Channel," arXiv: 1501.02473, January 2015).

As illustrated in FIG. 2, the number of bits at the output 202 of a polar encoder 200 is a power of 2 bits. For example, FIG. 2 shows 8 output bits shown as X1-X8 202. This imposes a restriction on the use of polar codes. In practical systems, the length of a number of information bits (K) and the coding rate (R) is pre-determined. This implies that the coded block length is determined as K/R. This number may not always be a power of 2. Hence, there may be a need for puncturing of the output bits of a polar encoder. Puncturing is one technique which may be used to remove some bits to abide by the power of 2 restriction. One natural way to encode K information bits at coding rate R may be to first find the smallest power of 2, which is larger than K/R. Then, puncturing may be performed from that number to reach K/R. For instance, given K=100 bits and $$R = \frac{1}{3},$$

it can be calculated that the coded block length is 300 bits. Here, a (512, 100) polar code may be used, followed by puncturing 212 bits from the outputs of the polar encoder.

There are several puncturing schemes available for polar codes. The quasi-uniform puncturing scheme (K. Niu, K. Chen and J. Lin, "Beyond Turbo Codes: Rate-Compatible Punctured Polar Codes," IEEE ICC 2013) and the weight-1 column reduction scheme (R. Wang and R. Liu, "A Novel Puncturing Scheme for Polar Codes," IEEE Communications letters, December 2014) are two typical puncturing schemes. It should be noted that unlike turbo codes or LDPC codes, the puncturing schemes of polar codes are related to code construction. In other words, depending on which bits are to be punctured from the output of polar encoder, the frozen bits set are to be adjusted accordingly. Frozen bits may refer to bits which remain fixed, e.g. '0' or '1', and may be used to make a matrix square.

LDPC codes were first developed by Gallager (R. Gallager, "Low Density Parity Check Codes", MIT Press, August 1963) and rediscovered in 1996 (D. MacKay and R. Neal, "Near Shannon Limit Performance of Low Density Parity Check Codes," Electronics Letters, July 1996). LDPC codes are linear block codes, which may be constructed using a sparse bipartite graph.

LDPC codes are defined by a sparse parity-check matrix. Consider a (N,K) LDPC code, where K is the information block length and N is coded block length. Its parity check matrix is of size (N−K)×N, whose majority elements are 0. As a linear block code, the encoding of an LDPC code is based on its generator matrix. The decoding of LDPC codes is based on a belief propagation algorithm or a sum-product decoding.

The design of a good LDPC code relies on the design of its parity check matrix. One type of LDPC code constructed in a deterministic and systematic way is called a quasi-cyclic LDPC code (QC-LDPC). See IEEE Std 802.11-2012, "Wireless LAN Medium Access Control (MAC) and Physical Layer (PHY) specifications" for a standardized implementation of QC-LDPC codes. A QC-LDPC code may be uniquely defined by its base matrix B with size J×L.

$$B = \begin{bmatrix} B_{1,1} & \cdots & B_{1,L} \\ \vdots & \ddots & \vdots \\ B_{J,1} & \cdots & B_{J,L} \end{bmatrix}.$$

Each component in the base matrix may be a p×p circulant permutation matrix or an all zero matrix. A positive integer value of $B_{i,j}$ represents the circulant permutation matrix which is circularly right shifted $B_{i,j}$ from the p×p identity matrix. The identity matrix is indicated by $B_{i,j}=0$, while a negative value of $B_{i,j}$ indicates an all zero matrix. It should be noted that N=L·p. Other ways to right shift or permute a matrix may be provided as well. For example, each row vector of the matrix may be rotated one element to the right relative to the proceeding row vector.

LDPC codes are adopted in several standards and used in many communication systems, for example, the DVB-S2 standard for satellite transmission of digital television, ITU-T G.hn standard, 10GBase-T Ethernet system, and the Wi-Fi 802.11 standard. Unlike the cellular communication systems, the above systems do not support hybrid automatic repeat request (HARQ) with incremental redundancy (HARQ-IR).

In 5G, there are a few use cases which make LDPC codes of particular use. First, there is a use case for ultra reliable and low latency (URLLC) communications and second, for machine-type-communications (MTC).

In a communication system deployed with soft combining HARQ, incorrectly received coded data blocks are often stored at the receiver rather than discarded, and when the re-transmitted block is received, the two blocks are combined.

There are two main methods in soft combining HARQ: chase combining (CC) and incremental redundancy (IR). In chase combining, the same information is sent at every retransmission. The receiver combines the received bits from the first transmission and all the retransmissions via maximum-ratio combining.

In incremental redundancy, different information may be sent at every retransmission. Multiple sets of coded bits are generated, each representing the same set of information bits. The retransmission typically uses a different set of coded bits than the previous transmission, with different redundancy versions generated by puncturing the encoder output. Thus, at every retransmission the receiver gains extra information.

SUMMARY

Embodiments are disclosed for using LDPC and polar codes in cellular and other communication systems. In a first embodiment, a same polar code may be used for successive HARQ retransmissions. In this embodiment, for each one of the retransmissions, a lower number of information bits may be transmitted along with or without a portion of the original transmission. This lower number of information bits may be structured to satisfy the power of 2 restriction imposed on polar codes. Alternatively, or in combination, different polar code schemes may be used for each one of the successive retransmissions.

Other embodiments disclosed herein involve LDPC codes, in particular, families of rate-compatible LDPC codes based on protographs. Protograph matrices may be used to generate parity check matrices for LDPC codes. In order to support smaller input block lengths of LDPC codes, for example used for data retransmissions, a family of protograph matrices from a base protograph matrix may be generated using a matrix lifting method. In this way, a coding rate may be modified to achieve a higher or lower rate.

In cellular communication systems, an amount of channel resources for certain user is limited. For example, in LTE, each user is given certain number of resource elements in a particular sub-frame. These resource elements should be utilized in such a way that information bits are communicated using an appropriate encoding method and thus at a well-chosen data rate.

A method for transmitting data using one or more LDPC codes may comprise selecting a base graph and a lifting size. The base graph may be lifted based on the lifting size and a sequence of bits may be encoded based on the lifted graph. The method may comprise writing the sequence of encoded bits into a circular buffer and transmitting a first portion of the sequence of encoded bits. The first portion may be selected based on a first redundancy version. A second portion of the sequence of encoded bits may also be transmitted. The second portion may be selected based on the lifting size and a second redundancy version. The first redundancy version and the second redundancy version may be different redundancy versions.

In an embodiment, a method may comprise transmitting a first signal derived from a first subset of a set of LDPC coded bits and transmitting a second signal derived from a second subset of the set of LDPC coded bits. The second subset may be selected from the set of LDPC coded bits based on a lifting size of an LDPC base graph. The method may further comprise receiving an indication of a first redundancy version. The transmitting the first signal may be in response to receiving the indication of the first redundancy version.

A method may comprise receiving a first signal comprising first LDPC bits including systematic bits and parity bits and transmitting information indicating that the first signal was incorrectly received. A second signal comprising second LDPC bits may be received in response to the transmitting. The second signal may include LDPC bits according to a lifting size of an LDPC base graph.

BRIEF DESCRIPTION OF THE DRAWINGS

A more detailed understanding may be had from the following description, given by way of example in conjunction with the accompanying drawings wherein.

DETAILED DESCRIPTION

Figure 1A:
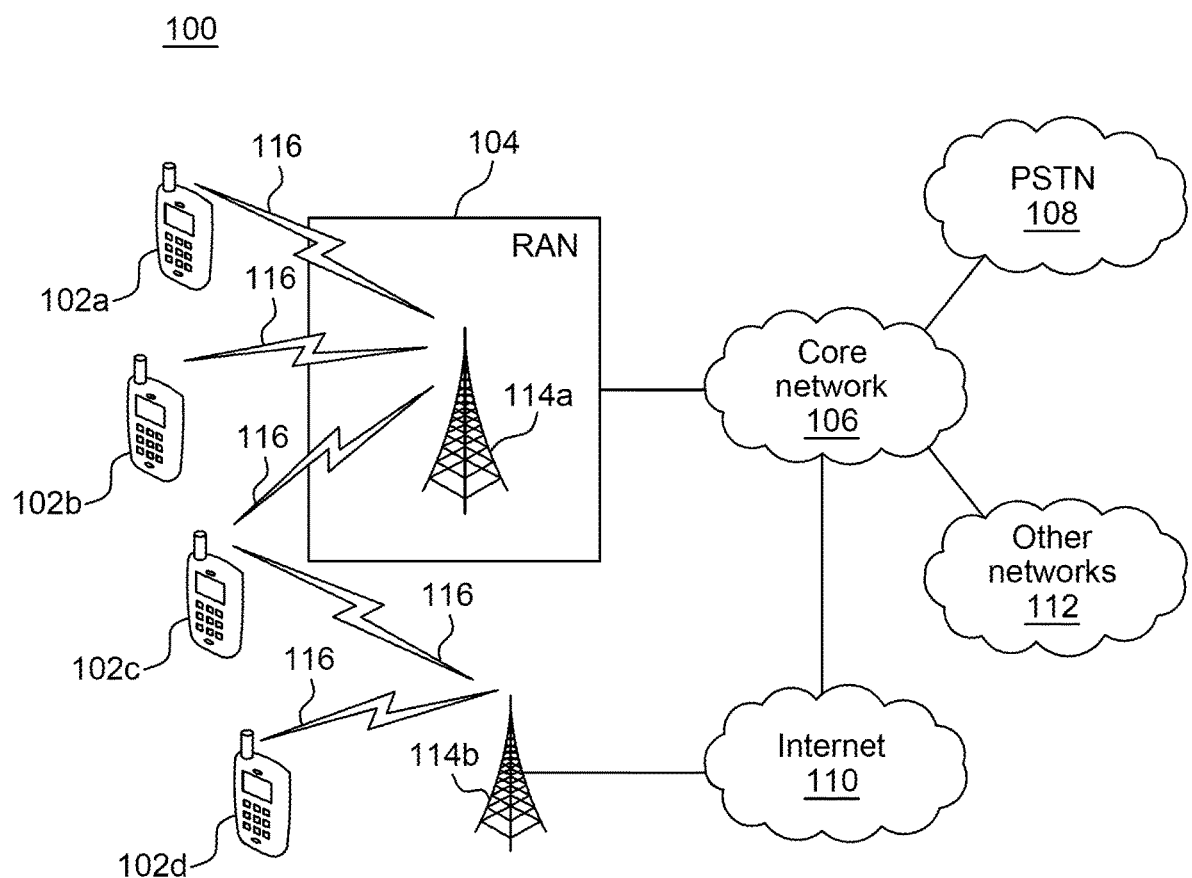
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 115/116 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., a eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
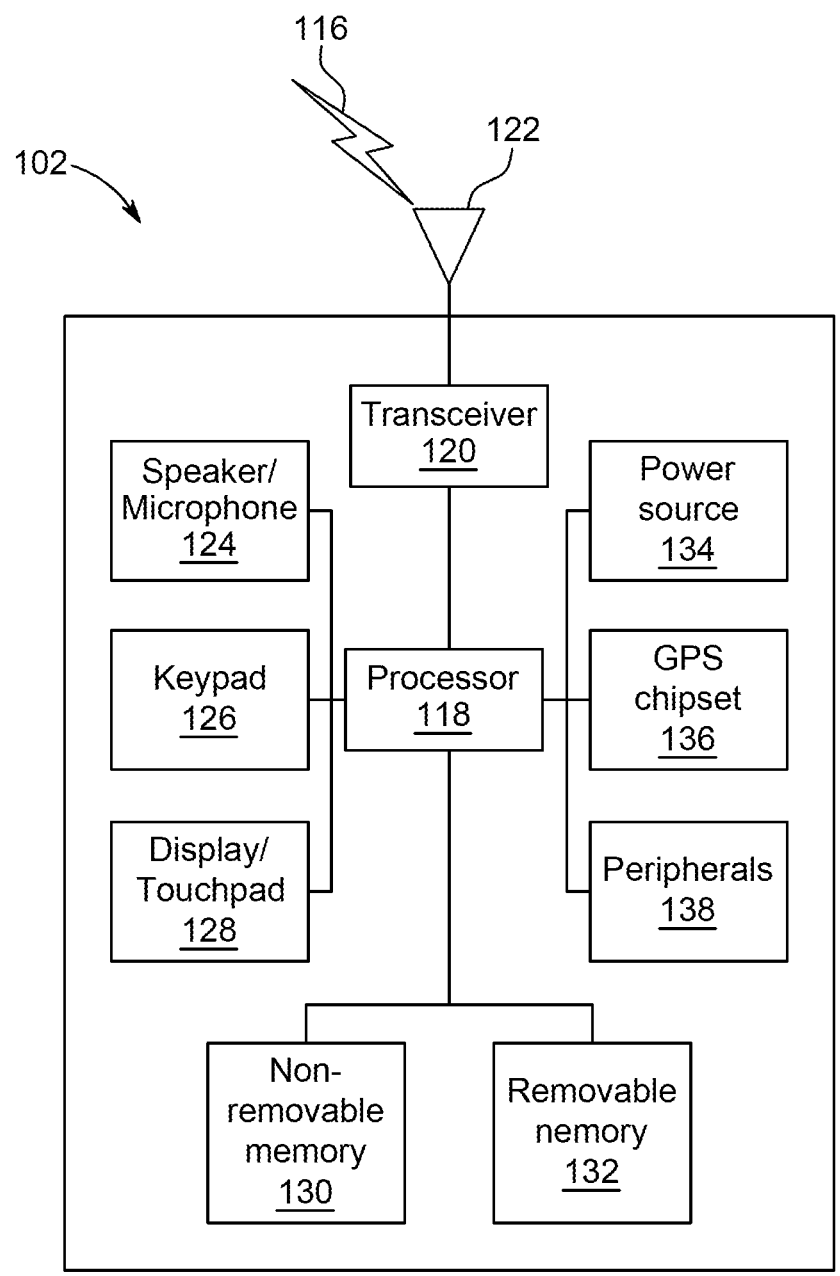
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit 139 to reduce and or substantially eliminate self-interference via either hardware (e.g., a choke) or signal processing via a processor (e.g., a separate processor (not shown) or via processor 118). In an embodiment, the WTRU 102 may include a half-duplex radio for which transmission and reception of some or all of the signals (e.g., associated with particular subframes for either the UL (e.g., for transmission) or the downlink (e.g., for reception)).

Figure 1C:
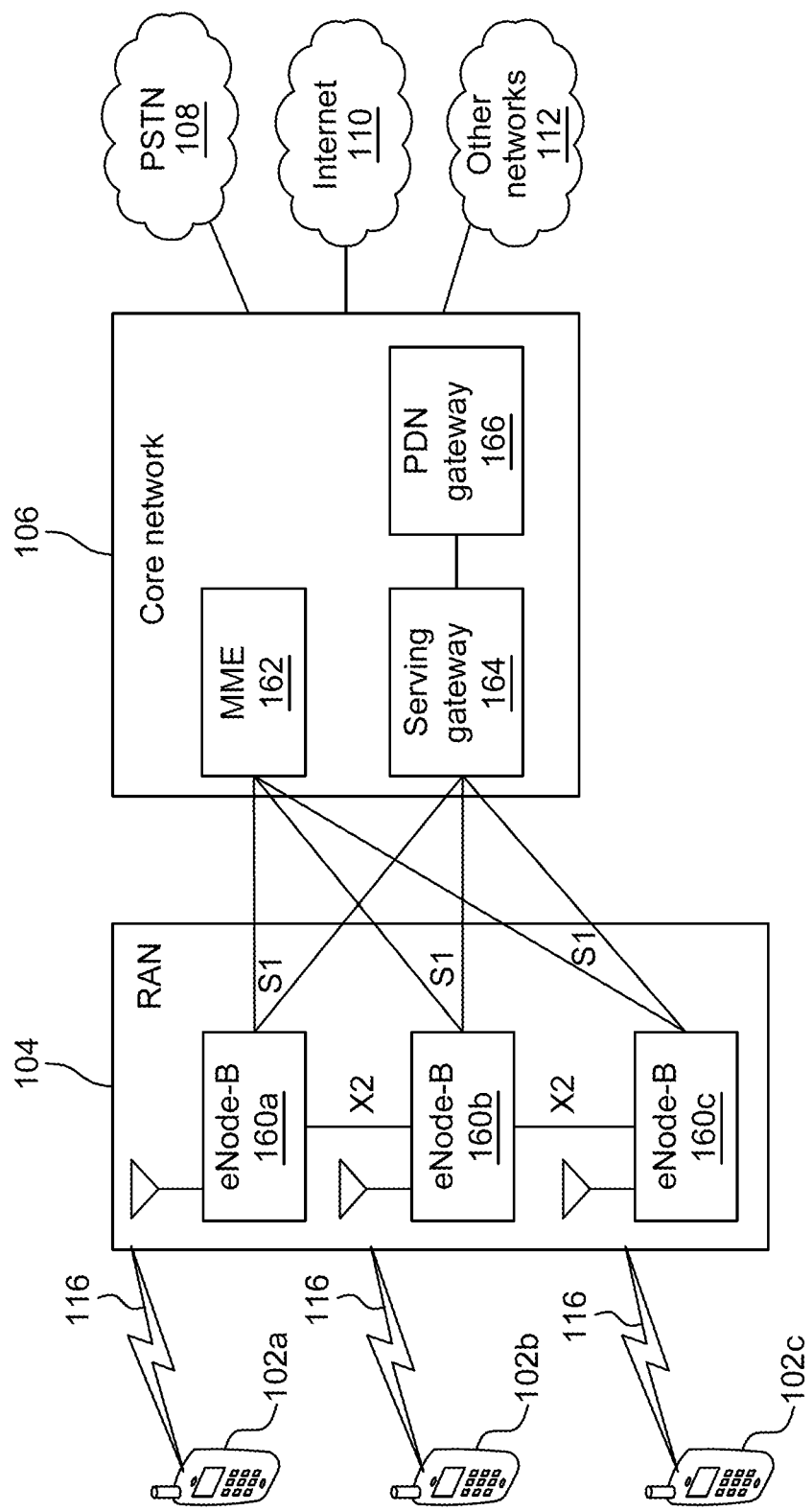
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
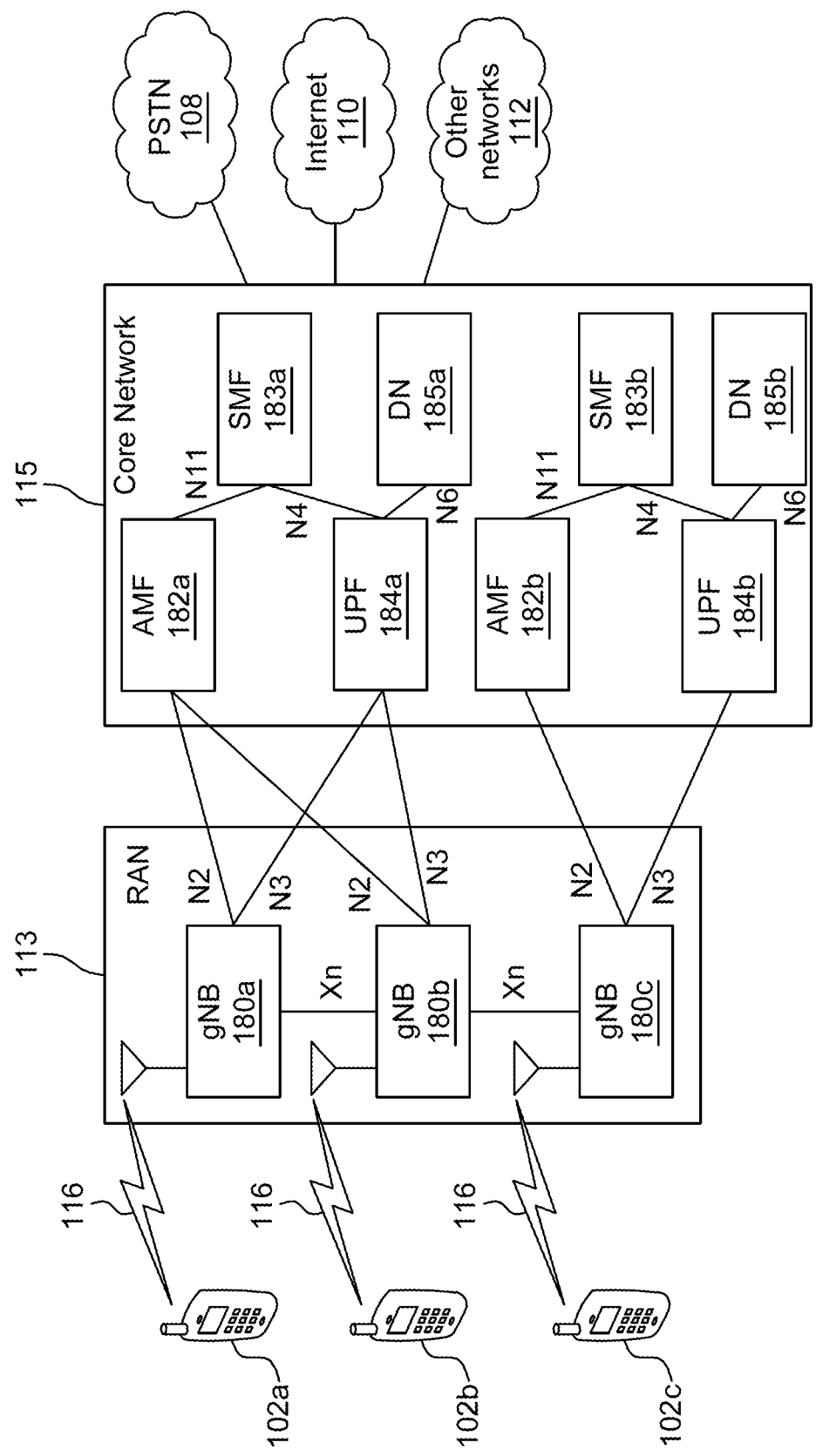
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a, 184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-ab, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

Hybrid Automatic Repeat Request (HARQ) schemes are widely used in cellular systems, for example, HSPA and LTE. These current cellular systems are deployed with a HARQ-CC scheme or a HARQ-IR scheme for turbo codes. Since polar codes were recently developed, the usage of polar codes in a HARQ scheme is of interest. A transmitter may simply send the same set of encoded bits to a receiver at each retransmission, while the receiver may combine the Log-Likelihood (LL) Ratio (LLR) or LL from different retransmissions before passing it to a normal polar decoder. The usage of polar codes in a HARQ-IR scheme is also of interest. A LLR is often used, for example in IEEE 802.11 standards, to enhance the error correction probability of forward error correction. LLR involves knowing a probably of a zero bit and a probability of a one bit being correctly received at a receiver. This bit error rate may be thought of as a performance of the transmission medium or channel. The error rate may be provided to a transmitter in a cellular system through a PHY or MAC or higher level information element. Another method may be to analyze ACK/NACK feedback at a transmitter and determine probabilities for each one of a plurality of channels.

Although many communication systems, for example, IEEE 802.11 systems adapt LDPC codes as their channel codes, those systems usually do not use HARQ schemes due to various reasons. Hence, the usage of LDPC codes in HARQ schemes is of interest.

In a first embodiment, polar codes using HARQ is described. B. Li (B. Li, "Polar Codes for 5G," North American School of Information Theory (NASIT), August 2015), proposes a method for using polar codes in a HARQ-IR scheme, called the Incremental Freezing HARQ scheme. Suppose that K information bits are to be transmitted at the initial coding rate R. For the purposes of illustration, it is assumed that the coded block length $$N = \frac{K}{R}$$

is a power of 2 in the following description.

It may be that, in a first transmission, a (N,K) polar code is used. These K information bits should be mapped to the K most reliable bit channels. In the case of a decoding failure of the first transmission, a $$\left(N, \frac{K}{2}\right)$$

polar code is used for the second transmission. It should be noted that, only $$\frac{K}{2}$$

information bits are encoded in the second transmission and the other $$\frac{K}{2}$$

information bits are left off. The $\frac{K}{2}$ information bits of the first transmission should be a subset of the K original information bits, which were sent via the least reliable bit channels in the first transmission. The receiver first tries to decode these $\frac{K}{2}$ information bits. A soft combining scheme may be applied by averaging the estimate of these $\frac{K}{2}$ information bits from both the first and second transmissions. The receiver then tries to re-decode the other $\frac{K}{2}$ information bits by filling in these $\frac{K}{2}$ decoded bits.

In the case of a decoding failure of the second transmission, a $$\left(N, \frac{K}{3}\right)$$

polar code may be used for a third transmission. In this way, only $\frac{K}{3}$ information bits are encoded in the third transmission. These $\frac{K}{3}$ information bits are selected from the K original information bits, which were sent via the least reliable bit channels in the first two transmissions. The receiver first tries to decode these $\frac{K}{3}$ information bits, then tries to decode the second retransmission by filling part of these $\frac{K}{3}$ decoded bits. Finally, the receiver tries to decode all the information bits from the first transmission.

In the case of a decoding failure on the third transmission, a $$\left(N, \frac{K}{4}\right)$$

polar code may be used in a fourth transmission. These $\frac{K}{4}$ information bits are selected nom the K original information bits, which were sent via the least reliable bit channels in the first three transmissions.

Figure 3:
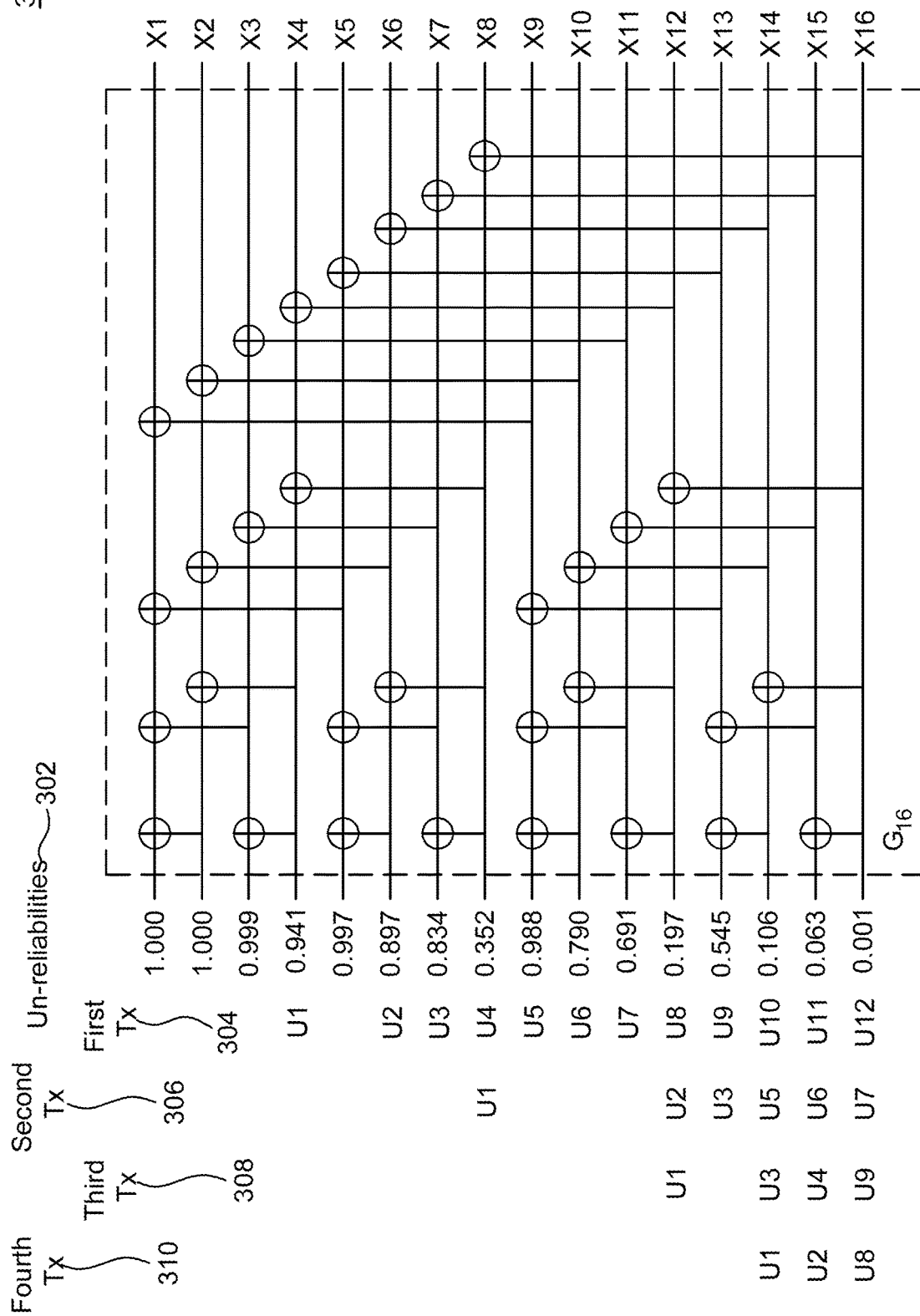
FIG. 3 illustrates an example of incremental freezing.

FIG. 3 shows an example 300 where K=12 and N=16. The probability of a channel being unreliable, hereinafter denoted as 'un-reliabilities' 302 of the bit channels, are also provided. In the first transmission 304, all the 12 information bits $U_1$-$U_{12}$ are placed on the high reliable bit channels {4, 6, 7, 8, 9, 10, 11, 12, 13, 14, 15, 16}. In the second transmission 306, 6 information bits {$U_1$, $U_2$, $U_3$, $U_5$, $U_6$, $U_7$} are placed on highly reliable bit channels {8, 12, 13, 14, 15, 16}. Here, the 6 information bits {$U_1$, $U_2$, $U_3$, $U_5$, $U_6$, $U_7$} are selected because they were placed on the less reliable bit channels in the first transmission, as compared to the other information bits {$U_7$, $U_8$, $U_9$, $U_{10}$, $U_{11}$, $U_{12}$}. With the second transmission 306, the reliabilities of these 6 information bits are increased because they are now placed on higher reliability channels. The reliability information should be continuously updated and may be referred to for further retransmission. The reliability information may be determined in part by one or more receivers transmitting feedback to the transmitter. The feedback may be sent as a bitmap and may be sent contained in a PHY or MAC control element (MAC-CE). A third transmission 308 may include information bits {$U_1$, $U_3$, $U_4$, $U_9$} sent on four highly reliable channels. A fourth transmission 310 may include information bits {$U_1$, $U_2$, $U_8$} sent on the three most reliable channels.

Figure 4:
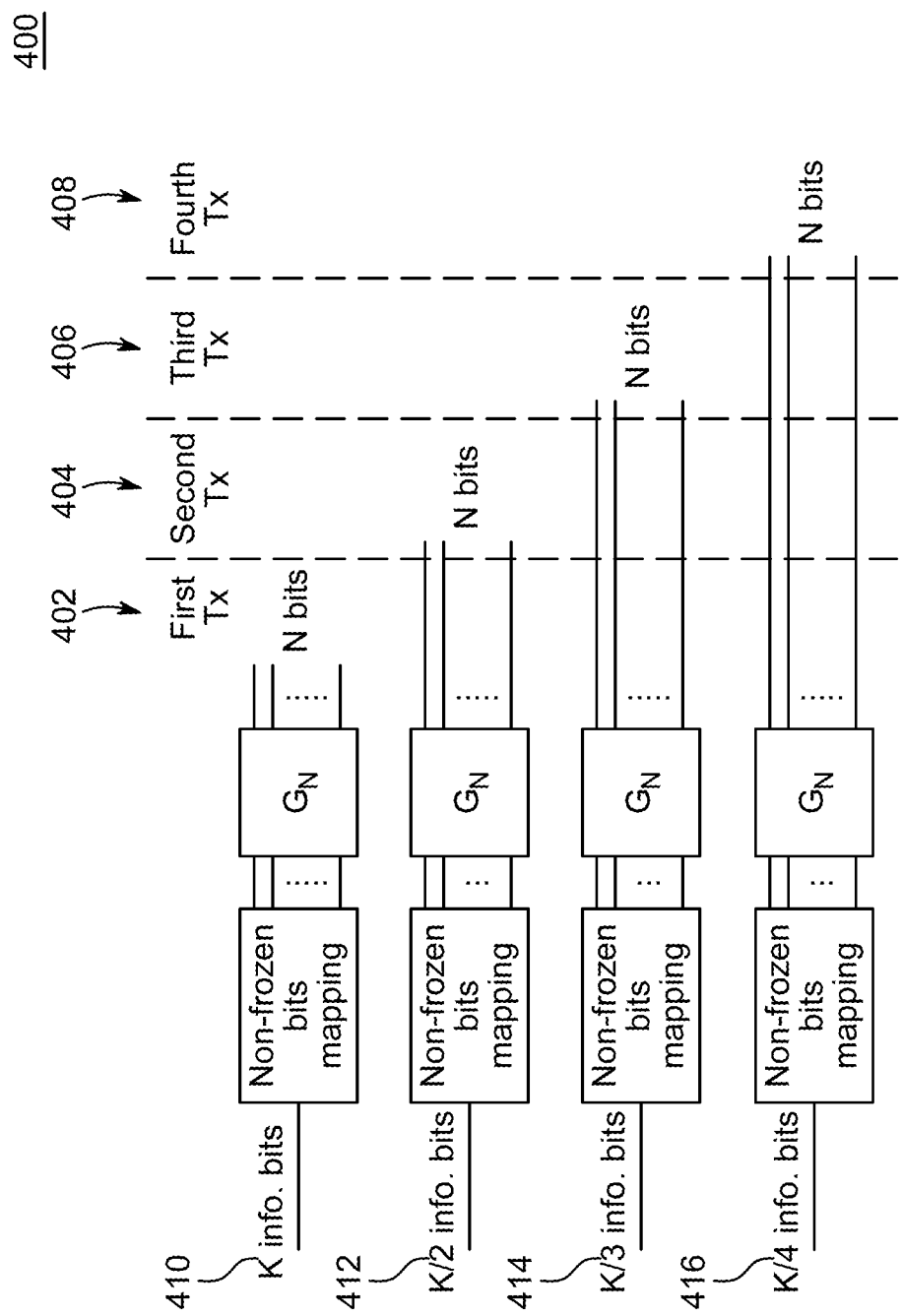
FIG. 4 illustrates retransmission schemes of incremental freezing.

FIG. 4 illustrates an overall incremental freezing HARQ-IR scheme. There are different HARQ retransmission schemes of which two alternative HARQ retransmission schemes are disclosed.

In one embodiment, a scheme for incremental freezing with diversified polar codes (IFDPC) HARQ 400 is disclosed. As shown in FIG. 4, the same polar code is used for all retransmissions 404-408 after the initial transmission 402. Instead of choosing a different polar code altogether, a different number of information bits is chosen. For example, in the first transmission 402, K information bits 410 are chosen. In the second transmission 404, $\frac{K}{2}$ bits 412 are chosen. In the third transmission 406, $$\frac{K}{3}$$

information bits 414 are chosen. Lastly, in a fourth transmission 408, $$\frac{K}{4}$$

information bits 416 are chosen. Due to the non-universal property of polar codes, certain polar codes may fit well in certain channel conditions, but not in other channel conditions. The non-universal property means that a code used must be tailored to accurately fit a channel in order to transmit close to capacity. It may also be desirable to introduce diversity among retransmissions as well. This may be achieved by using different polar codes for different retransmissions. Hence, the HARQ scheme is proposed and called Incremental Freezing with Diversified Polar Codes (IFDPC).

One way to diversify transmissions is to use different design SNR's of a certain code construction scheme in each transmission. For example, the polar code used in a first transmission may be based on a certain construction scheme, for example, Bhattacharyya bounds. The polar code used in the second transmission may be based on design SNR $X_2$ dB. The polar code used in the third transmission is based on design SNR $X_3$ dB. The polar code used in the fourth transmission is based on design SNR $X_4$ dB, and so forth.

An alternative way to diversify transmissions is to use different code construction schemes in each transmission. For example, the polar code used in the first transmission is based on the Bhattacharyya bounds; the polar code used in the second transmission is based on the Monte-Carlo estimation. The polar code used in the third transmission is based on the full transition probability matrices estimation, and so forth. Other alternative polar code schemes may additionally be used in combination.

Figure 5:
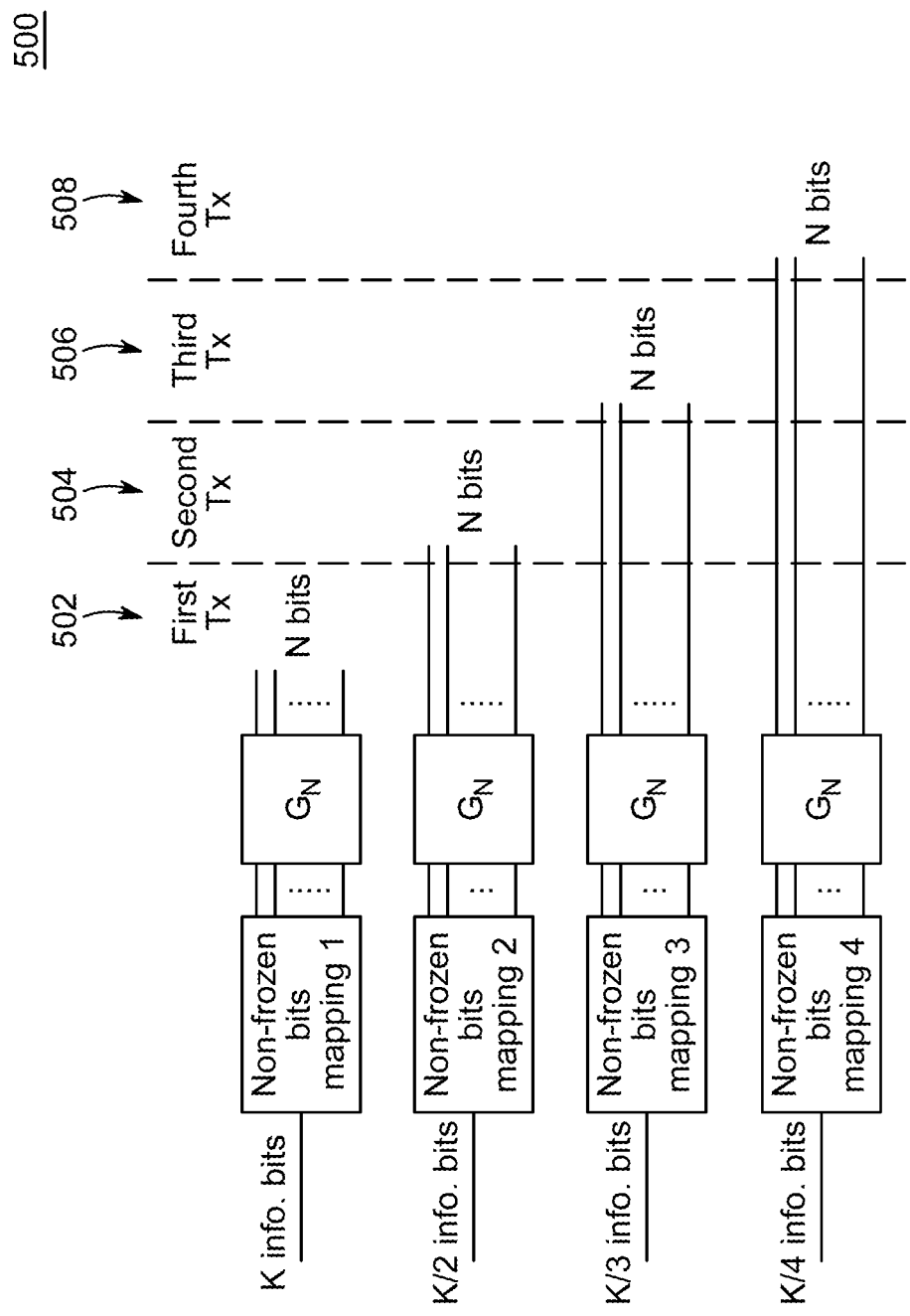
FIG. 5 illustrates different polar codes used in the incremental freezing scheme.

FIG. 5 illustrates a HARQ-IR scheme 500 in which the above two alternative ways may be mixed. For example, the polar code used in the first transmission 502 is based on the Bhattacharyya bounds at design SNR $X_1$ dB; the polar code used in the second transmission 504 is based on the Bhattacharyya bounds at design SNR $X_2$ dB; the polar code used in the third transmission 506 is based on the Gaussian approximation at design SNR $X_3$ dB; the polar code used in the fourth transmission 508 is based on the full transition probability matrices estimation at design SNR $X_4$ dB. A Bhattacharyya bounds estimation may be considered to be an unbiased estimation of a parametric function.

In another embodiment, a scheme for incremental redundancy with reduced size polar codes (IRRSPC) HARQ is provided. Herein, another HARQ scheme is disclosed which is based on reduced size polar codes for retransmissions. This scheme can be considered as the mixture of chase combining and incremental redundancy. This HARQ scheme is referred to as the IRRSPC scheme.

As used herein, K information bits are referred to as bits to be transmitted, and the initial coding rate is referred to as R. For ease of illustration, it is assumed that the coded block length $$N = \frac{K}{R}$$

is a power of 2 at this moment.

Figure 6:
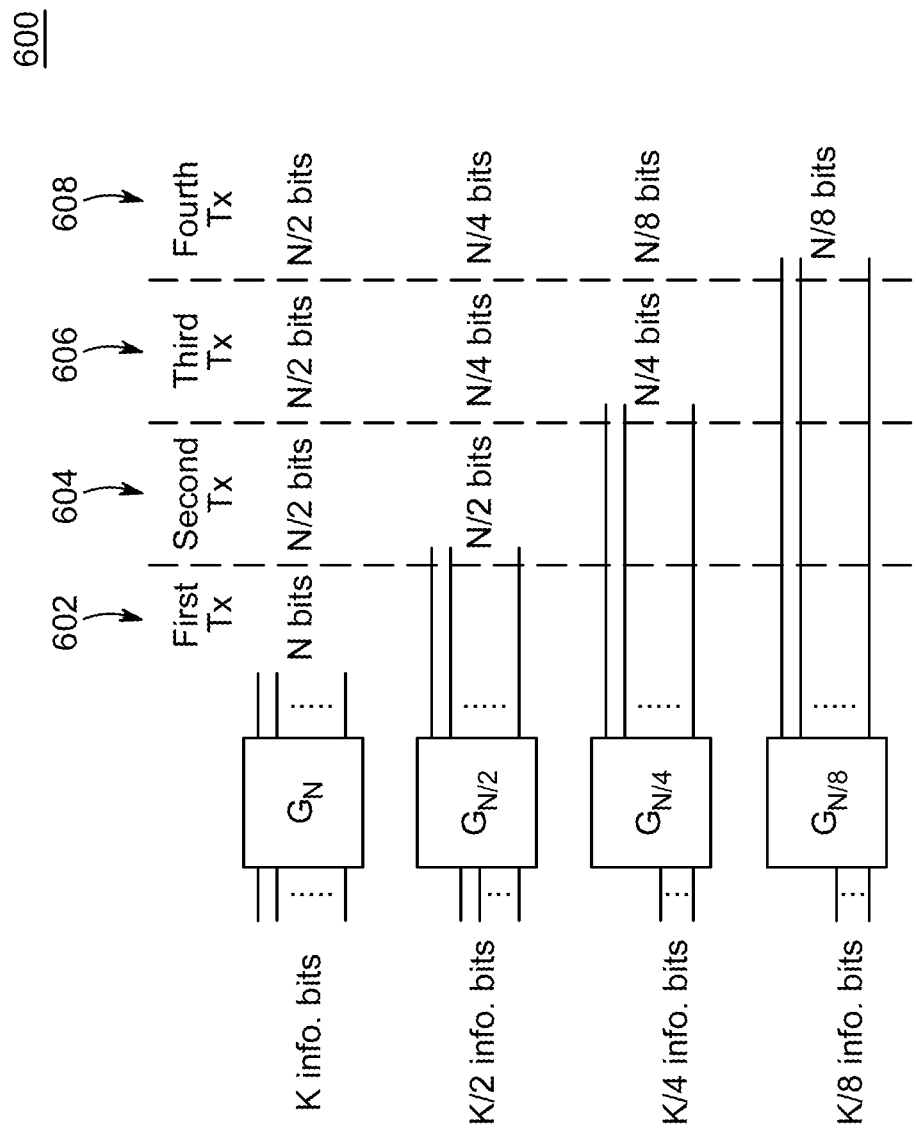
FIG. 6 illustrates polar codes with a smaller block length used for retransmissions.

FIG. 6 illustrates a polar code transmission method 600 employing a smaller block length used in retransmissions. In the first transmission 602, a (N,K) polar code is used. These K information bits are mapped to the K most reliable bit channels. In case of decoding failure on the first transmission, a $$\left(\frac{N}{2}, \frac{K}{2}\right)$$

polar code may be used for the second transmission 604. Here, the transmitter first selects $$\frac{K}{2}$$

information bits from the K original information bits, which were sent via the least reliable bit channels in the first transmission. These $$\frac{K}{2}$$

bits are encoded by a $$\left(\frac{N}{2}, \frac{K}{2}\right)$$

polar code, resulting in $$\frac{N}{2}$$

encoded bits. In order to keep the number of transmitted bits in the second transmission 604 the same as that of the first transmission 602, half of the transmitted bits are also selected in the first transmission 602, i.e., $$\frac{N}{2}$$

bits. Then, the $$\frac{N}{2}$$

newly encoded bits from the $$\left(\frac{N}{2}, \frac{K}{2}\right)$$

polar code and $\frac{N}{2}$ encoded bits of the original transmission, from the (N,K) polar code, are sent in the second transmission 604, as shown. The selection of $\frac{N}{2}$ bits from the N bits of the first transmission may have various options, for example, the first $\frac{N}{2}$ bits, the last $\frac{N}{2}$ bits, the middle $\frac{N}{2}$ bits, or the interleaved $\frac{N}{2}$ bits, etc. A third transmission 606 may include $\frac{N}{4}$ bits and a fourth transmission 608 may include $\frac{N}{8}$ bits.

Figure 7:
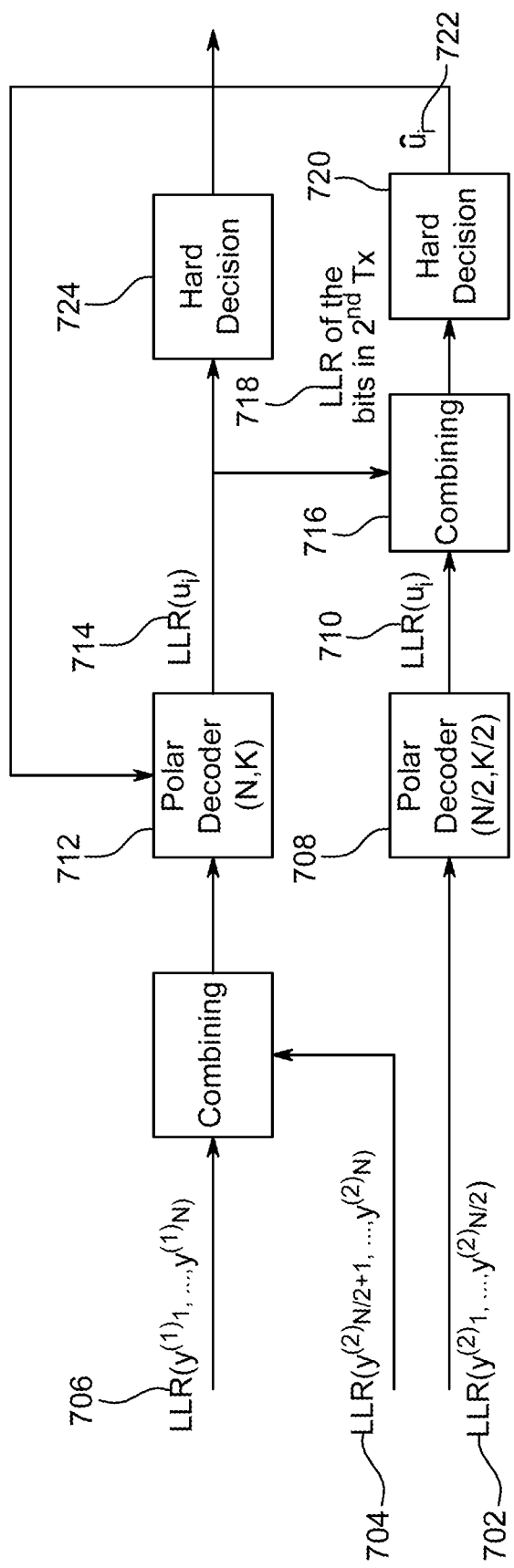
FIG. 7 illustrates decoding after second transmission for the incremental redundancy with reduced size polar codes hybrid automatic repeat request scheme.

FIG. 7 illustrates a block diagram of a receiver 700. As described herein, the operations performed by receiver 700 are referred to in steps, however, one of ordinary skill in the art will recognize that certain elements of the disclosed steps may overlap with other steps or elements of the following steps may be substituted. In step a, once the receiver 700 receives the second transmission, the receiver 700 demodulates the symbols and obtains the LLR of the transmitted bits. Suppose the first half of the N transmitted bits are the $\left(\frac{N}{2}, \frac{K}{2}\right)$ outputs of the polar code 702 and the second half 704 of the N transmitted bits 706 are part of the outputs of the (N,K) polar code.

In step b, the former $\frac{N}{2}$ LLRs 710 of the encoded bits 702 by the $\left(\frac{N}{2}, \frac{K}{2}\right)$ polar code are decoded by the $\left(\frac{N}{2}, \frac{K}{2}\right)$ polar decoder 708 first. This results in $\frac{K}{2}$ LLRs of the corresponding information bits. In step c, the latter $\frac{N}{2}$ LLRs of the encoded bits 704 by the (N,K) polar code are combined with the corresponding LLRs of the encoded bits from the first transmission 706, for example, via maximum ratio combining. These combined LLRs of the encoded bits are passed through the polar decoder of the (N,K) polar code 712 to generate the LLRs of the K information bits 714.

In step d, the LLRs 710 of the $\frac{K}{2}$ information bits from the $\left(\frac{N}{2}, \frac{K}{2}\right)$ decoder 708 are combined via combiner 716 with the corresponding LLRs 718 from the (N,K) decoder 712. Then a hard decision 720 is applied on these information bits. Decoded information bits 722 are passed to the decoder of (N,K) polar code 712 for an improved decoding of all the K information bits. There may be several iterations of step c and step d. A second hard decision 724 may be made to determine the final output bits.

In case there is a decoding failure on the second transmission, a $\left(\frac{N}{4}, \frac{K}{4}\right)$ polar code may be used in the third transmission. Here, the transmitter first selects $\frac{K}{4}$ information bits from the K original information bits, which were sent via the least reliable bit channels in the first two transmissions. These $\frac{K}{4}$ bits are encoded by a $\left(\frac{N}{4}, \frac{K}{4}\right)$ polar code, resulting in $\frac{N}{4}$ encoded bits.

In order to keep the number of transmitted bits in the third transmission the same as that in the previous transmissions, half of the transmitted bits in the first transmission (i.e., $\frac{N}{2}$ bits) may be selected, and half of the transmitted bits in the second transmission (i.e., $\frac{N}{4}$ bits) may be selected. Then, the $\frac{N}{4}$ newly encoded bits from the $\left(\frac{N}{4}, \frac{K}{4}\right)$ polar code, $\frac{N}{4}$ encoded bits from the $\left(\frac{N}{2}, \frac{K}{2}\right)$ polar code, and $\frac{N}{2}$ encoded bits from the (N,K) polar code are sent in the third transmission, as shown in FIG. 6 The selection of $\frac{N}{2}$ bits from the N bits of the first transmission may be those not selected in the second transmission, or other options. The selection of $\frac{N}{4}$ bits from the second transmission may have various options, for example, the first $\frac{N}{2}$ bits, the last $\frac{N}{2}$ bits, the middle $\frac{N}{2}$ bits, etc.

Figure 8:
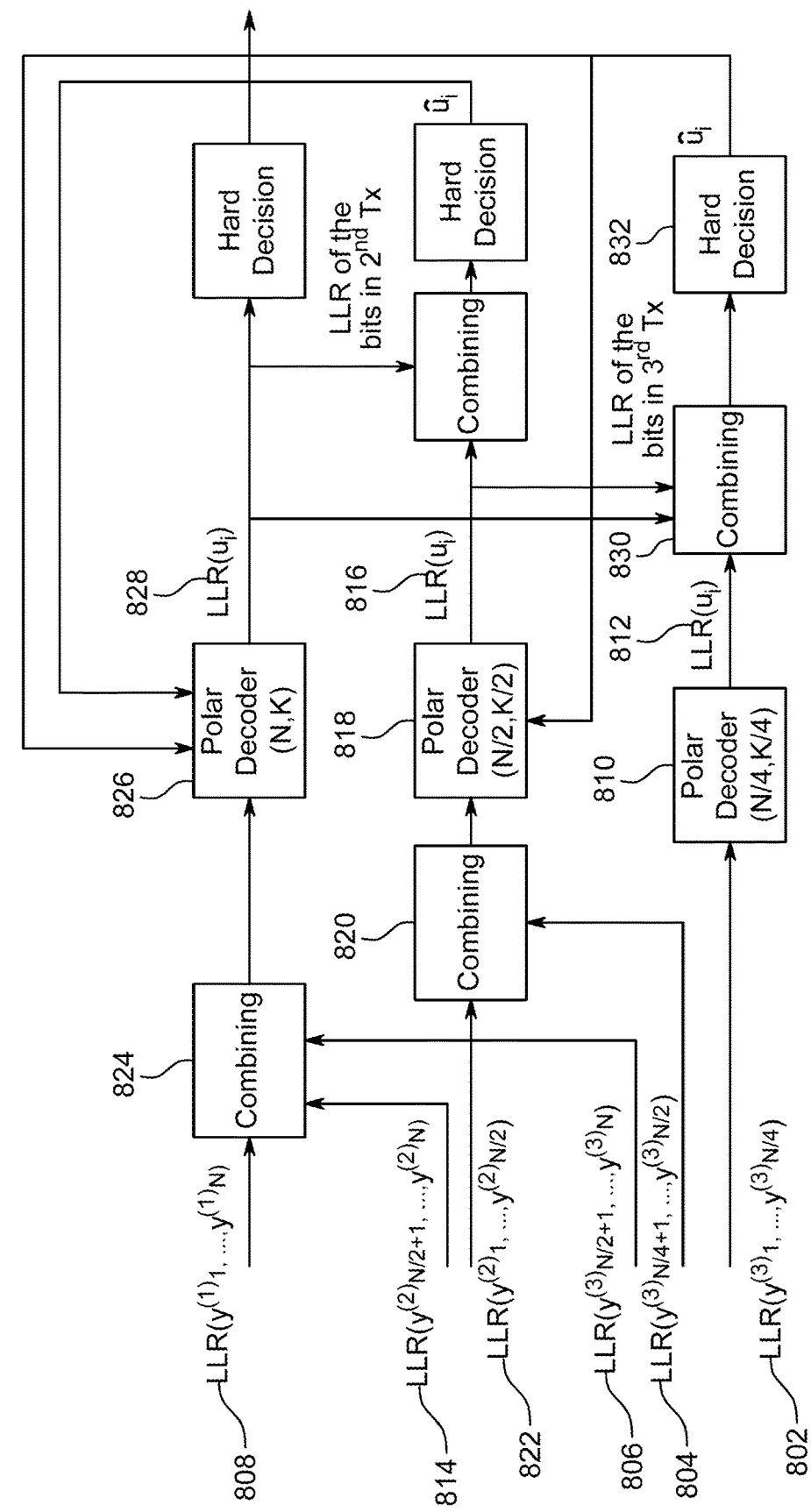
FIG. 8 illustrates decoding after third transmission for the incremental redundancy with reduced size polar codes hybrid automatic repeat request scheme.

FIG. 8 illustrates operations performed at a receiver 800. In step a, once the receiver 800 receives a third transmission, the receiver demodulates the symbols and obtains the LLR of the transmitted bits. Suppose, for example, the first quarter of the N transmitted bits 802 are the outputs of the $\left(\frac{N}{4}, \frac{K}{4}\right)$ polar code, the next quarter of the transmitted bits 804 are from the $$\left(\frac{N}{2}, \frac{K}{2}\right)$$

polar code, and the second half of the N transmitted bits 806 are from the (N,K) polar code.

In step b, the first $$\frac{N}{4}$$

LLRs 812 of the encoded bits by the $$\left(\frac{N}{4}, \frac{K}{4}\right)$$

polar code are to be decoded by $$\left(\frac{N}{4}, \frac{K}{4}\right)$$

polar decoder 810 first. This results in $$\frac{K}{4}$$

LLRs 812 of the corresponding information bits.

In step c, the second $$\frac{N}{4}$$

LLRs 804 of the encoded bits by the $$\left(\frac{N}{2}, \frac{K}{2}\right)$$

polar code are combined via combiner 820 with the corresponding LLRs of the encoded bits from the second transmission 822, for example, via maximum ratio combining. These combined LLRs of the encoded bits are passed through the decoder for the $$\left(\frac{N}{2}, \frac{K}{2}\right)$$

polar code 818 to generate the LLRs 816 of the $$\frac{K}{2}$$

information bits.

In step d, the last $$\frac{N}{2}$$

LLRs 806 of the encoded bits by the (N,K) polar code are combined via combiner 824 with the corresponding LLRs of the encoded bits from the first transmission 808 and 814, for example, via maximum ratio combining. These combined LLRs of the encoded bits are passed through the decoder for the (N,K) polar code 826 to generate the LLRs 828 of the K information bits.

In step e, the LLRs 812 of the $$\frac{K}{4}$$

information bits from the $$\left(\frac{N}{4}, \frac{K}{4}\right)$$

decoder 810 are combined via combiner 830 with the corresponding LLRs 828, 816 from the (N,K) decoder 826 and the $$\left(\frac{N}{2}, \frac{K}{2}\right)$$

decoder 818. Then a hard decision 832 is applied on these information bits. Then the decoded information bits from the hard decision 832 are passed to the $$\left(\frac{N}{2}, \frac{K}{2}\right)$$

polar decoder 818 and the (N,K) polar decoder 826 for an improved decoding. There may be several iterations of steps c-e.

In case of a decoding failure on the third transmission, a $$\left(\frac{N}{8}, \frac{K}{8}\right)$$

polar code may be used (not shown) in a fourth transmission. In this embodiment, the transmitter may first select $$\frac{K}{8}$$

information bits from the K original information bits, which were sent via the least reliable bit channels in the first three transmissions. These $$\frac{K}{8}$$

bits may then be encoded by a $$\left(\frac{N}{8}, \frac{K}{8}\right)$$

polar code, resulting in $$\frac{N}{8}$$

encoded bits.

In order to keep the number of transmitted bits in the fourth transmission the same as the number of bits used in previous transmissions, half of the transmitted bits in the first transmission (i.e., $$\frac{N}{2}$$

bits), half of the transmitted bits in the second transmission (i.e., $$\frac{N}{4}$$

bits) and hall of the transmitted bits in the third transmission (i.e., $$\frac{N}{8}$$

bits) may be selected, as shown in FIG. 6.

It should be noted that each one of the disclosed FIGS. 3-13, provide an exemplary method for bit allocation in each retransmission. For example, in the third transmission 606 of FIG. 6, $$\frac{N}{4}$$

bits are from the $$\left(\frac{N}{4}, \frac{K}{4}\right)$$

polar code;

$$\frac{N}{4}$$

bits are from the $$\left(\frac{N}{2}, \frac{K}{2}\right)$$

polar code;

$$\frac{N}{2}$$

bits are from the (N,K) polar code.

Other ways of bits allocation are also possible. For example, in the third transmission, $$\frac{N}{4}$$

bits from the $$\left(\frac{N}{4}, \frac{K}{4}\right)$$

polar code;

$$\frac{N}{2}$$

bits are from the $$\left(\frac{N}{2}, \frac{K}{2}\right)$$

polar code;

$$\frac{N}{4}$$

bits are from the (N,K) polar code. Overall, any combination of the bits allocation from different polar codes is possible.

In order to reuse some or all of the polar encoder hardware to implement the Reduced Size Polar Codes for IRRSPC scheme, it is disclosed to ignore any n stages of XOR operations within the polar encoder $G_N$ to produce $$N' = \frac{N}{2^n}$$

output bit from N output bits by polar encoder $G_N$.

For example, generating N'=4 bits output from N=8 bits output, a polar encoder may be implemented by ignoring any n=1 stage which results in any of the following methods: the selection of $[X_1, X_2, X_3, X_4]$ or $[X_5, X_6, X_7, X_8]$ is to ignore the third stage; the selection of $[X_1, X_3, X_5, X_7]$ or $[X_2, X_4, X_6, X_8]$ is to ignore the first stage.

Figure 9:
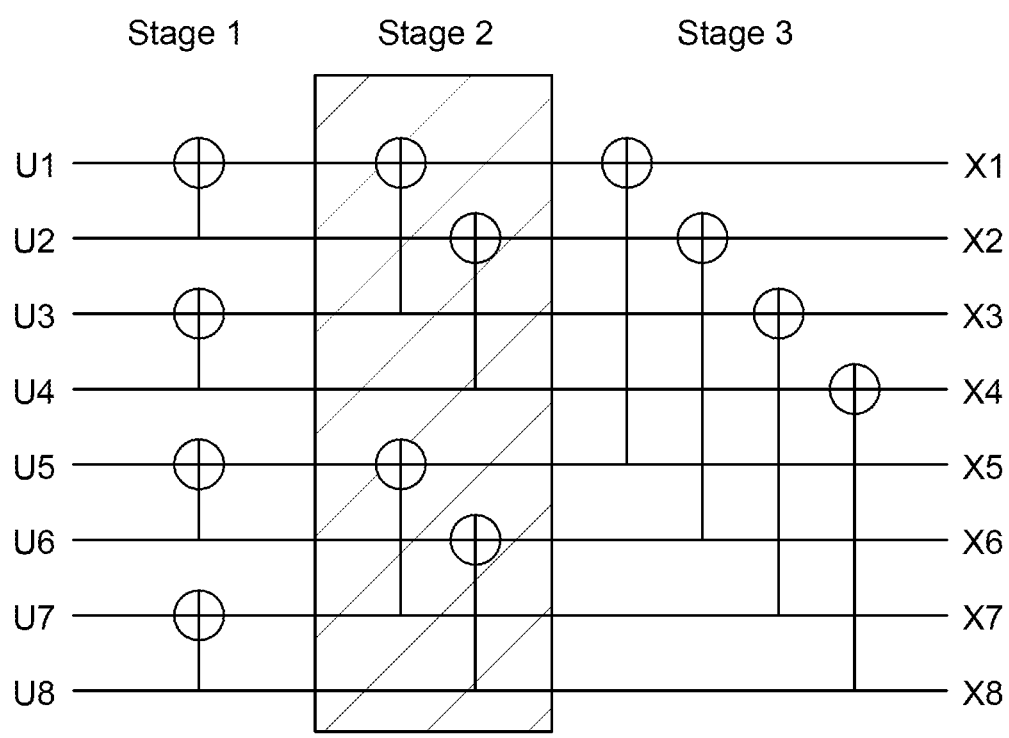
FIG. 9 illustrates an example implementation of reuse of $G_8$ for $G_4$, by ignoring stage 2.

FIG. 9 shows a selection 900 of 4 of 8 bits. The selection of $[X_1, X_2, X_5, X_6]$ or $[X_3, X_4, X_7, X_8]$ to may be performed in order to ignore the second stage. The inputs to the polar encoder are adjusted accordingly. In this way, bits of a first stage, e.g. $[X_1, X_3, X_5, X_7]$ or $[X_2, X_4, X_6, X_8]$, may not be ignored. Bits of a third stage, e.g. $[X_1, X_2, X_3, X_4]$ or $[X_5, X_6, X_7, X_8]$ of may also not be ignored. Ignoring of bits at the encoder side may improve simplicity at both the encoder and decoder side. The same may be said with respect to power usage at the transmitter and receiver. Ignored bits may be determined to utilize only better or best transmission channels.

In another embodiment, CRC bits are used in retransmissions. As mentioned above, one of the advanced polar decoder algorithm is CRC ("cyclic redundancy check")-Aided SCL decoding. According to this decoding algorithm, some CRC bits are set as inputs to the polar encoder as appendix to the source information bits. These CRC bits may be used as criteria in selecting a set of decoded bits from a list of candidates.

In the disclosed HARQ schemes, it is not specified as to whether CRC bits are appended to the information block. In one embodiment, the CRC bits may be contained in the first transmission. However, from the reliability ranking criteria used in transmission bits reselection, it is a rational assumption that the information bits used for the retransmissions are not CRC protected. This may lead to decoding performance degradation.

To achieve a better decoding performance with the help of CRC bits, appending the CRC bits to the information bits for each retransmission is disclosed.

Figure 10:
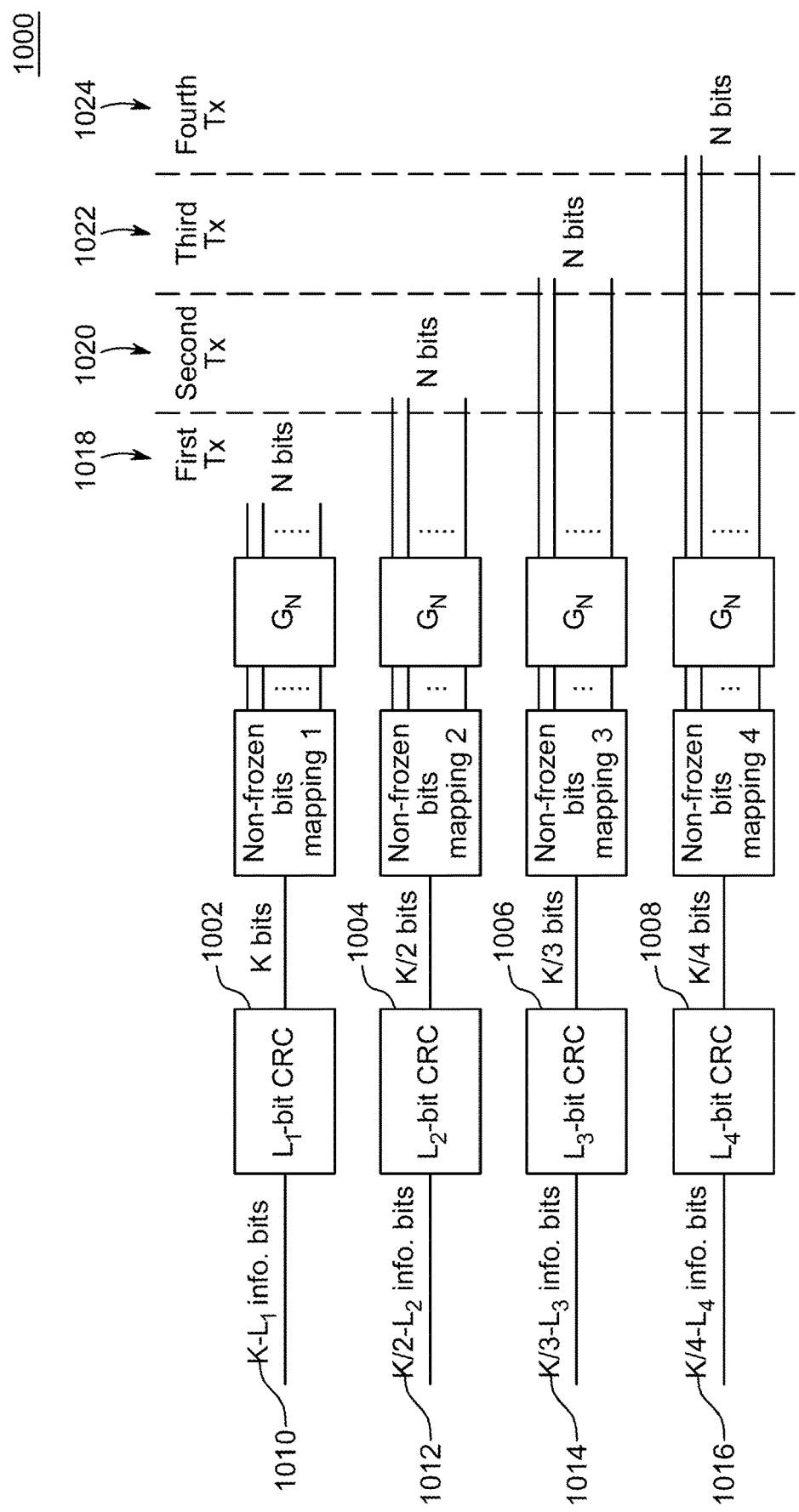
FIG. 10 illustrates updated incremental freezing with diversified polar codes hybrid automatic repeat request scheme with cyclic redundancy check bits appended for each retransmission.
Figure 11:
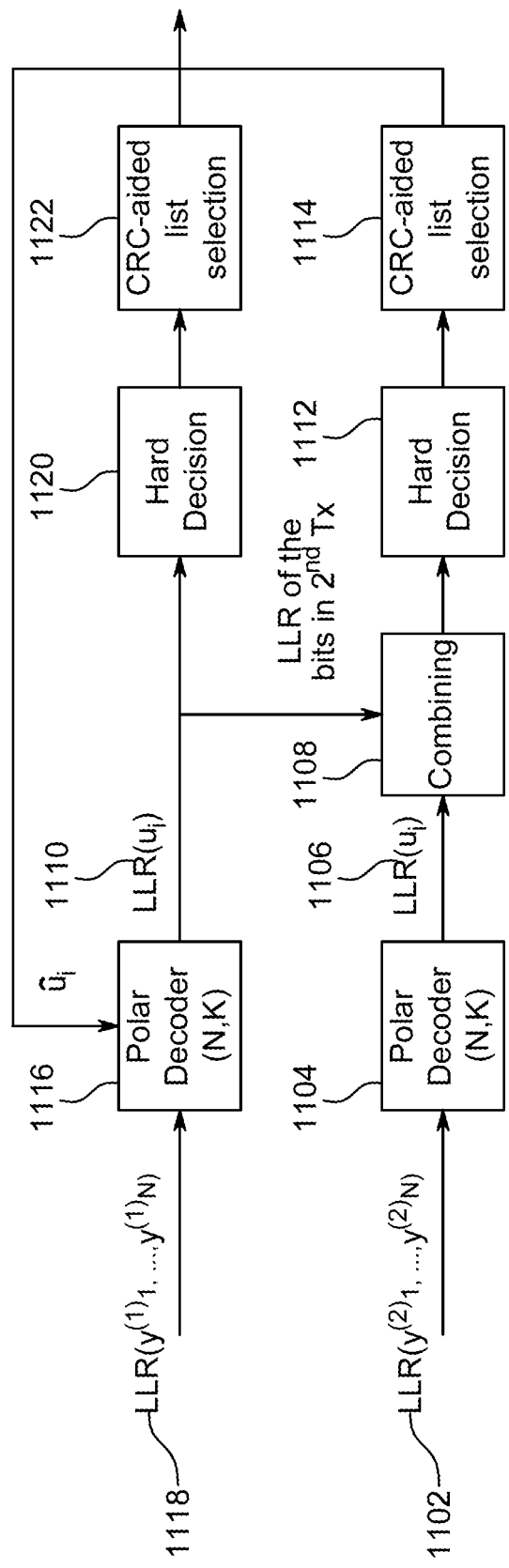
FIG. 11 illustrates updating decoding after second transmission for the incremental freezing with diversified polar codes hybrid automatic repeat request scheme.

FIG. 10 shows an extension 1000 of the IFDPC HARQ scheme of FIG. 5. As seen in FIG. 10, CRC bits 1002-1008 are appended to information bits 1010-1016 before each retransmission. Since a different number of information bits are transmitted at each one of the first 10118, second 1020, third 1022 and fourth transmission 1024, the number of CRC bits may be different for each retransmission. With the CRC appended, the decoding algorithm may be updated accordingly, as shown in FIG. 11. A similar CRC appending extension of the IRRSPC scheme may also be applied.

On one hand, the CRC bits may be used to improve the performance of polar codes. On the other hand, they may increase the overhead of the polar codes, leading to reduced actual coding rate. This actual coding rate reduction is significant when the length of information block length is small.

Consider the example shown in FIG. 10. In FIG. 10, the actual coding rate of the first transmission 1018 is $$\frac{K-L_1}{N};$$

the actual coding rate of the second transmission 1020 is $$\frac{\frac{K}{2}-L_2}{N};$$

the actual coding rate of the third transmission 1022 is $$\frac{\frac{K}{3}-L_3}{N};$$

and the actual coding rate of the fourth transmission 1024 is $$\frac{\frac{K}{4}-L_4}{N}.$$

If the CRC length is kept the same in all transmissions, then the number of information bits encoded in the retransmissions is limited, as the total number of bits to be encoded is reduced in each retransmission. This may reduce the performance.

Hence, it is disclosed to use a smaller CRC size for each one of the retransmissions. In one embodiment, $L_1 \geq L_2 \geq L_3 \geq L_4$. For example, $L_1=24$, $L_2=16$, $L_3=8$, $L_4=0$, or $L_1=24$, $L_2=8$, $L_3=8$, $L_4=0$. In an example where a first transmission may employ a 32 bit CRC size, retransmissions may be, for example, $L_1=32$, $L_2=16$, $L_3=8$, $L_4=0$, or for a 16 bit CRC, $L_1=16$ $L_2=8$, $L_3=8$, $L_4=0$.

In another embodiment, puncturing schemes are used in retransmissions. As disclosed above, the number of output bits of a polar encoder is assumed to always be a power of 2. However, given a certain information block length and coding rate, the coded block length is in general not a power of 2. Hence, the puncturing of polar encoder output bits is performed. There are several puncturing schemes, e.g., quasi-uniform puncturing scheme (K. Niu, K. Chen and J. Lin, "Beyond Turbo Codes: Rate-Compatible Punctured Polar Codes," IEEE ICC 2013), or weight-1 column reduction puncturing scheme (R. Wang and R. Liu, "A Novel Puncturing Scheme for Polar Codes," IEEE Communications letters, December 2014) etc. Each puncturing scheme may have its application domain.

With HARQ retransmissions, deploying different puncturing schemes for different retransmissions to increase the decoding performance via diversity may be employed in an effort to increase transmission redundancy.

FIG. 11 illustrates updating decoding 1100 after a second transmission for the IFDPC HARQ request scheme. With reference to FIG. 11, after receiving a transmission 1102, bits corresponding to the transmission 1102 are polar decoded using an (N,K) polar decoder 1104. The LLRs 1106 corresponding to the (N,K) polar decoder 1104 are combined 1108 with LLRs of a second transmission polar decoding 1110. A hard decision 1112 is made and a CRC-Aided list selection 1114 is performed. The output of the CRC-aided list selection 1114 is fed back into the polar decoder 1118 corresponding to the second transmission 1116, a hard decision is made 1120, and a final CRC-aided list selection 1122 may be performed.

Figure 12:
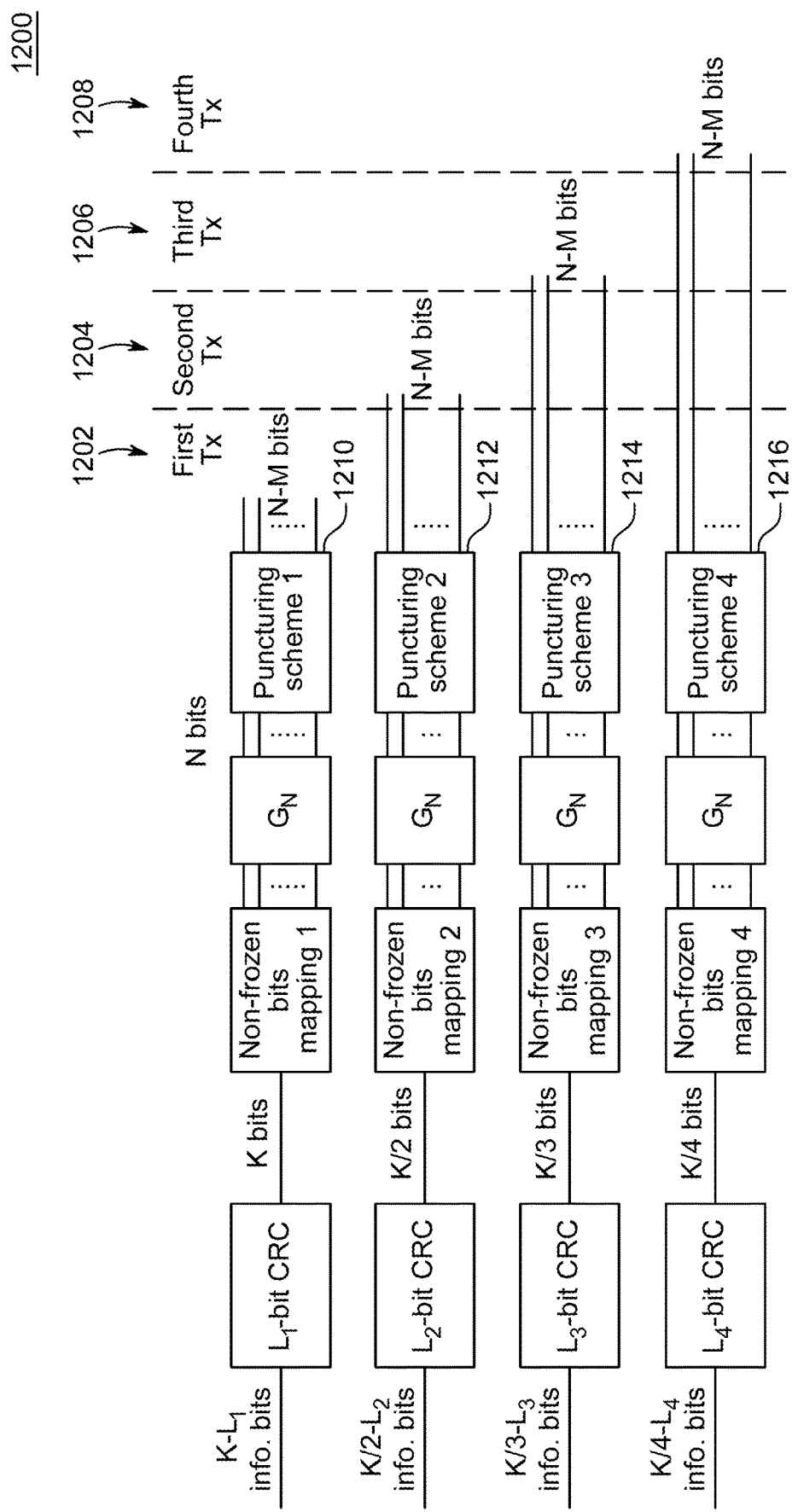
FIG. 12 illustrates a method for updating the incremental freezing with diversified polar codes hybrid automatic repeat request scheme by applying different puncturing schemes for retransmissions.

FIG. 12 illustrates an updated puncturing scheme 1200 which may be utilized in conjunction with the IFDPC HARQ scheme. The first transmission 1202 is associated with puncturing scheme 1 1210; the second transmission 1204 is associated with puncturing scheme 2, the third transmission is associated with puncturing scheme 3 1214 and the fourth transmission 1208 is associated with puncturing scheme 4 1216. As shown in FIG. 12, at each transmission 1202-1208 N-M bits are output.

Figure 13:
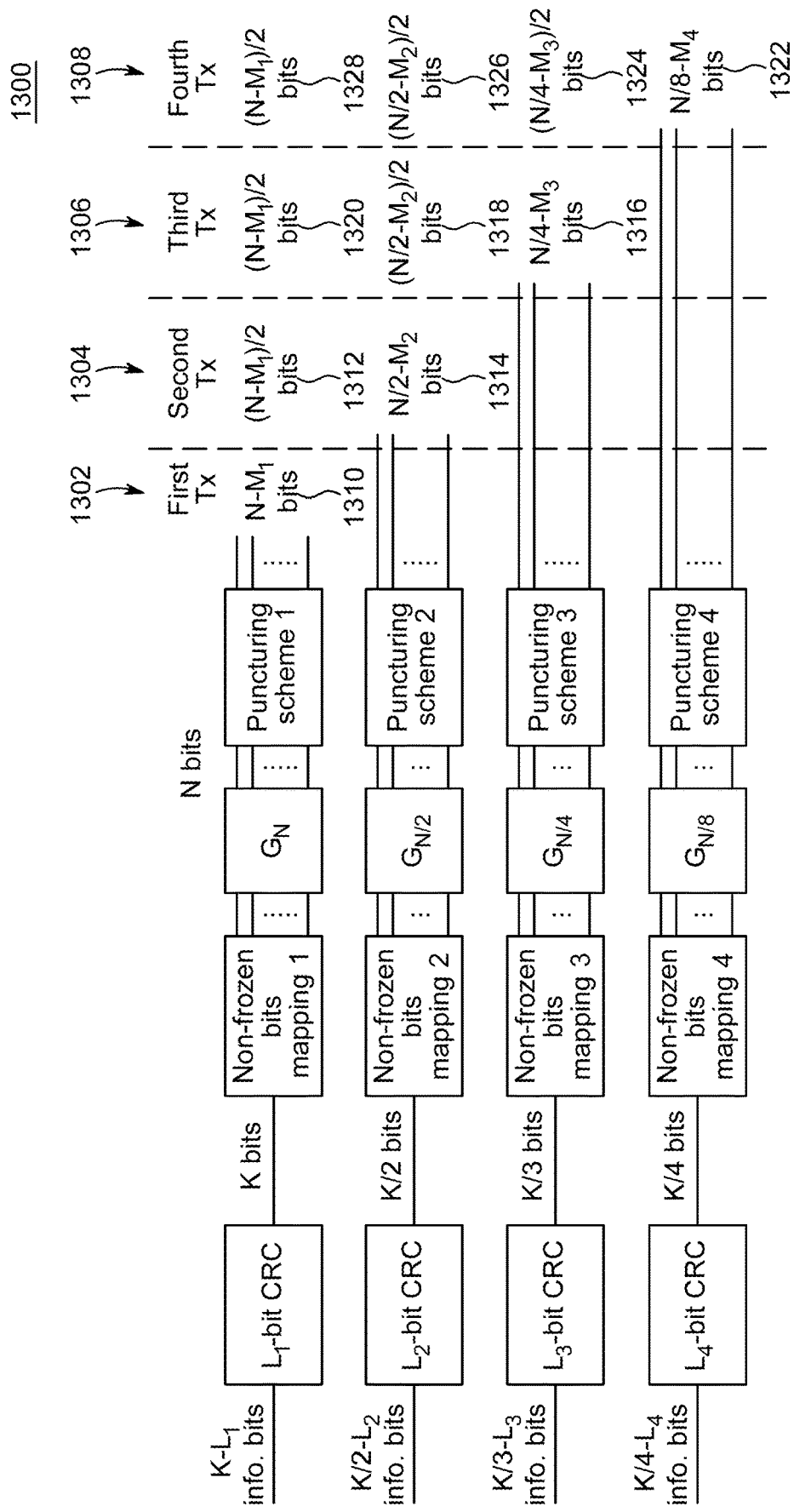
FIG. 13 illustrates updating the incremental redundancy with reduced size polar codes hybrid automatic repeat request scheme by different puncturing schemes used for retransmissions.

FIG. 13 illustrates an embodiment 1300 in which puncturing schemes employed for the IRRSPC HARQ scheme are different. Since the outputs of a polar encoder may have different lengths for each transmission, the corresponding number of punctured bits may also be different. Suppose that the number of punctured bits is $M_i$ for the polar code used in the i-th transmission, then there are $N-M_1$ bits 1310 sent in a first transmission 1302, $N-M_2$ bits 1312-1314 sent in the second transmission 1304, $N/4-M_3$ bits 1316-1320 sent in a third transmission 1306 and $N/8-M_4$ bits 1316-1320 sent in a fourth transmission 1308. The $$\left(\frac{N}{2}, \frac{K}{2}\right)$$

polar code may be used and $M_2$ bits may be punctured for half of the contents for the second transmission. Hence, $$M_2 = \frac{M_1}{2}.$$

Following the same logic, $$M_i = \frac{M_1}{2^i}$$

may be used to determine a number of punctured bits for the i-th transmission. It should be noted that other choices of $M_i$ are also possible.

Figure 14:
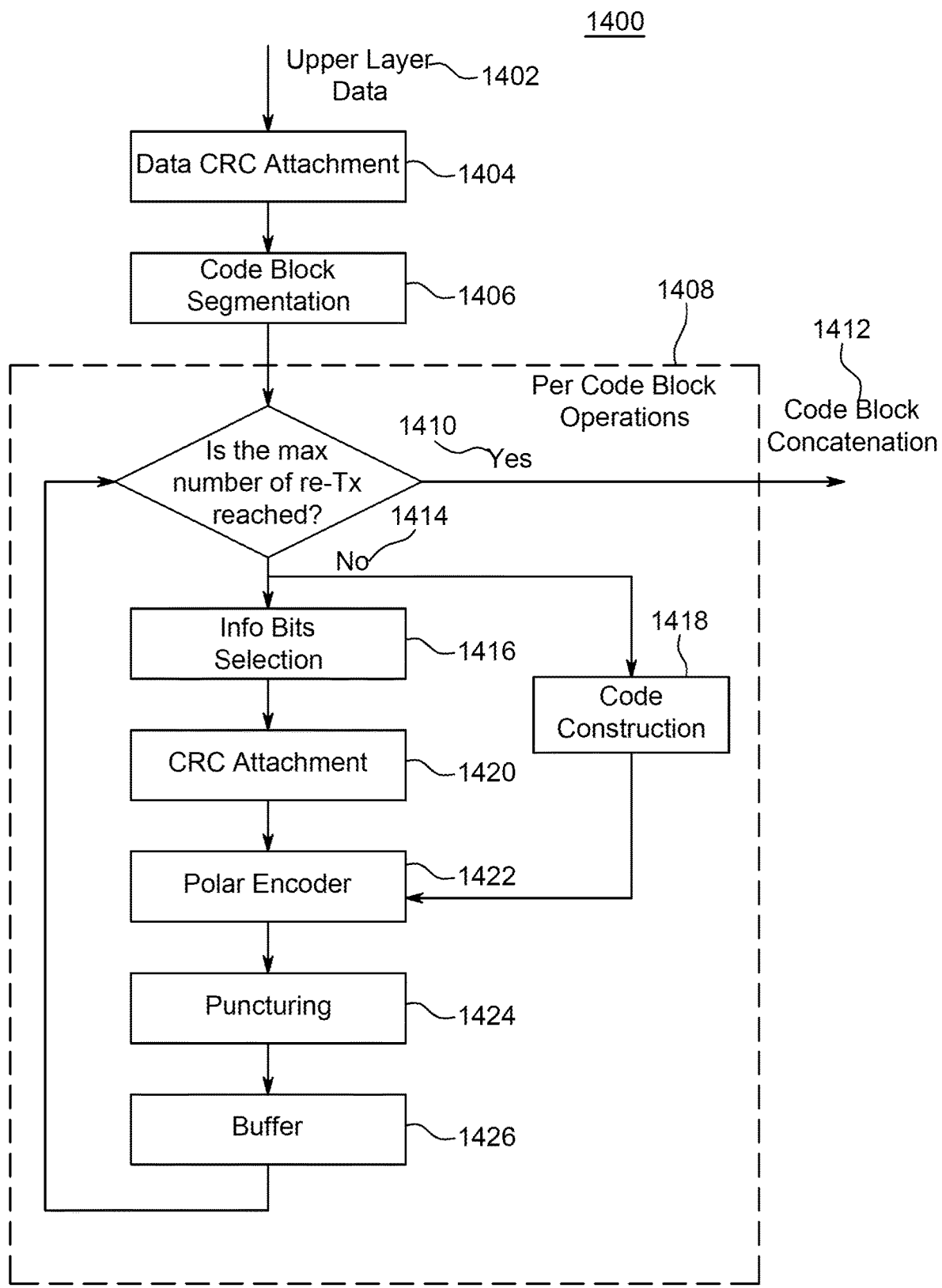
FIG. 14 is a flow diagram for polar encoding with hybrid automatic repeat request support.

FIG. 14 illustrates a polar encoding method 1400 to support HARQ. In particular, FIG. 14 shows an exemplary flow diagram of a polar encoding system supporting HARQ. When data, for example, a transport block, is received 1402 from the upper layer, the CRC of the data is appended 1404. The whole set of data and CRC are segmented 1406 to smaller information block size to fit the polar code.

Suppose the maximum number of retransmissions for certain data is fixed, say T. Then, the per code block operations 1408 have T loops. If the maximum number of retransmissions has been reached 1410, code block concatenation 1412 is performed. If the maximum number of retransmission has not been reached 1414, the loop is entered.

Within each loop, the transmitter first determines the information bits to be encoded for this transmission 1416. The information bits to be encoded for the first transmission are generally the whole block of information bits. The information bits to be encoded for the subsequent retransmissions may be a subset of the whole information block. For example, according to the basic Incremental Freezing HARQ scheme, half of the information block may be encoded in the second transmission; one third of the information block may be encoded in the third transmission; one fourth of the information block may be encoded in the fourth transmission. By the IRRSPC HARQ scheme, half of the information block may be encoded in the second transmission; one fourth of the information block may be encoded in the third transmission; one eighth of the information block may be encoded in the fourth transmission. The "Info Bits Selection" block 1416 handles the above process.

Besides selecting information bits for different transmissions, the polar code to be used for each transmission may be updated. For example, different polar codes, either of the same output length as shown in FIG. 5 or of different output lengths as shown in FIG. 6, are used for different transmissions. This process may be handled by the "Code Construction" block 1418 in FIG. 14.

It should be noted that the advanced polar decoding algorithm (CRC-Aided SCL) uses the CRC bits for the list selection among several candidate lists. To enable this decoding algorithm, CRC bits are appended 1420 to the information bits. Since the information bits used for different transmissions may be different, the corresponding CRC bits may need to be generated per transmission. The number of CRC bits generated for subsequent transmissions may be different, as described in herein. The process is handled by the "CRC Attachment" block 1420 in FIG. 14.

Figure 2:
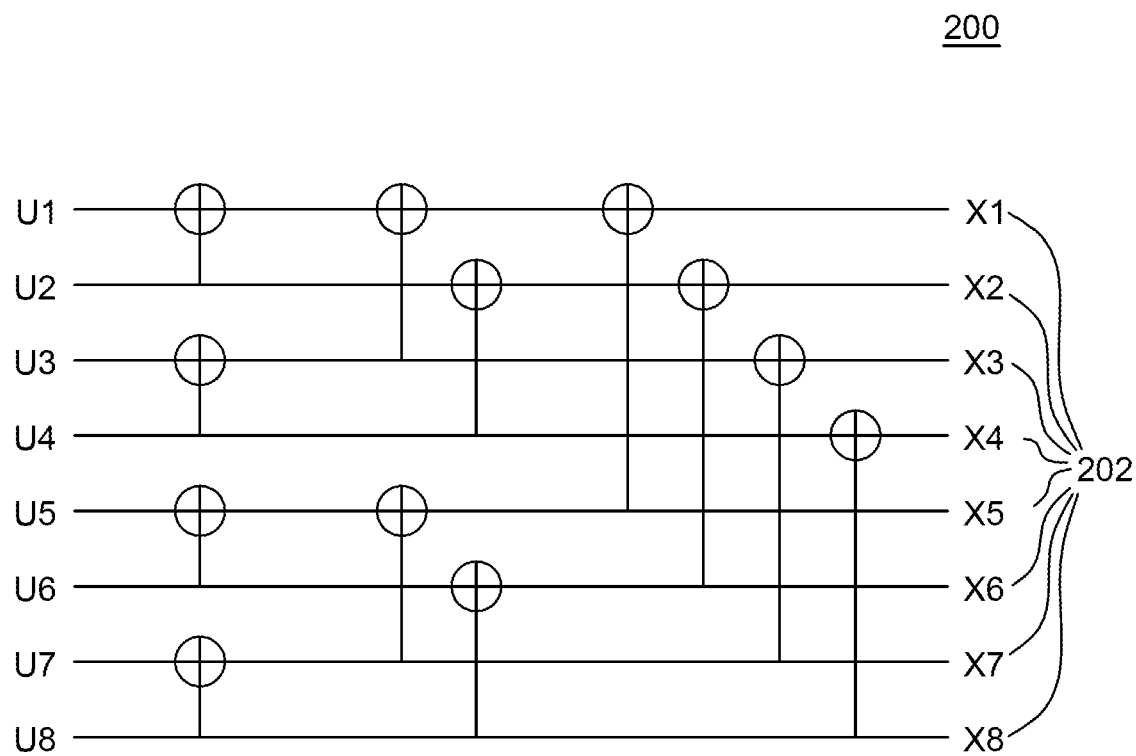
FIG. 2 shows a polar encoder having an N=8 coded block length.

The "polar encoder" block 1422 may include the normal encoding process, as in FIG. 2. The resulting encoded bits may then be punctured in the "Puncturing" block 1424, with the puncturing schemes described herein. The punctured bits are saved in a buffer 1426 for transmissions. For the sake of latency reduction, the encoded bits for all the transmissions may be generated and saved in one shot.

It should be noted that this flow diagram also applies to chase combining by artificially setting the maximum number of retransmissions to be 1.

HARQ-IR for LDPC codes are now described. A family of rate-compatible LDPC codes based on protographs, or blueprints for constructing LDPC codes of arbitrary size is disclosed. The protograph matrices may be used to generate the parity check matrices H for LDPC codes. In this method, protographs and hence LDPC codes are first designed for a very low coding rate and then used in an intelligent way to generate different redundancy versions (RVs).

The steps involved in the process are described as follows.

Consider a base protograph matrix A. This may be a low code-rate protograph, for example, the protograph matrix in (Ericsson, R1-164358, Performance Evaluation of Turbo Codes and LDPC Codes at Lower Code Rates, 3GPP TSG RAN WG1 Meeting #85).

Suppose this base protograph matrix A is of size P×(P+K), with each element being an integer value in the range of [−1,Z−1], where Z is the lifting value. The corresponding parity check matrix H is generated from the protograph matrix A, by expanding each element in A to a Z×Z matrix in the following way: The value of '−1' represents an all zero matrix; the value of '0' represents an identity matrix; other integer values represent circularly right shifted versions of the identity matrix. It should be noted that the parity check matrix H is of size (P·Z)×[(P+K)·Z]. This implies that the input block length is K·Z, the number of parity bits is P·Z, and the coding rate is $$\frac{K}{K+P}.$$

As seen above, the input block length for the LDPC code from the base protograph matrix is K·Z. To support different, for example smaller, input block lengths of the LDPC codes, a family of protograph matrices from the base protograph matrix A can be generated by a matrix lifting method.

A protograph matrix $A_i$ can be generated from the base protograph matrix A, based on an integer $Z_i$, where $1 \leq Z_i \leq Z$. The size of $A_i$ is identical to that of A, and each element of $A_i$ is equal to the corresponding element of A with modulo $Z_i$. Here, if an element in A is '−1', then it is also '−1' in $A_i$.

Each protograph matrix $A_i$ corresponds to a parity check matrix $H_i$. This parity check matrix is generated by expanding each element in $A_i$ to a $Z_i \times Z_i$ matrix in the same way as that for the base protograph matrix. Hence, $H_i$ is of size $(P \cdot Z_i) \times [(P+K) \cdot Z_i]$. This implies that the input block length is $K \cdot Z_i$, the number of parity bits is $P \cdot Z_i$, and the coding rate is $$\frac{K}{K+P}.$$

In other words, the tamely of protograph matrices can support various input block lengths, based on various values of $Z_i$.

It should be noted that not every integer between 1 and Z is a good selection for $Z_i$. Some integer values are not valid for $Z_i$ because the resulting parity check matrix $H_i$ is not invertible in GF2 (Galois field of 2). This family of protograph matrices support the information bits granularity of K bits, if not considering the discrete selection of $Z_i$. If further considering the discrete selection of $Z_i$, then the information bits granularity may be a multiple of K bits. To reduce the granularity of the information bits, some shortening scheme may be applied. Specifically, some zero padding is added to information bits to increase the overall size to $Z_i$, for some good selection of $Z_i$.

As seen above, the coding rate of the LDPC codes generated from the family of protograph matrices $A_i$ is $$\frac{K}{K+P}.$$

To support different (higher) coding rates, a subset of the protograph matrix may be used. For example, a subset matrix may be composed of the first p rows and the first p+K columns from a protograph matrix $A_i$, for some p≤P. The resulting LDPC code may have a coding rate $$\frac{K}{K+p},$$

which is higher than $$\frac{K}{K+P}.$$

In many cases, the channel coding rate R is determined based on the channel conditions. Then, the value of p may be determined such that $$\frac{K}{K+p} = R.$$

In other words, the value of p is determined as $$\frac{K}{R} - K.$$

With the above configurations, different input block sizes and different coding rates may be supported. The largest information block length is K·Z, and the smallest coding rate is $$\frac{K}{K+P}.$$

Hence, The largest coded block length is (K+P)·Z.

In many communication systems, the amount of channel resources for certain user is limited. For example, in LTE system, each user is given certain number of resource elements (say, $N_{RE}$) in a sub-frame. Given the channel condition, the modulation order is determined as M bits per symbol and the channel coding rate is determined as R. This implies that the total number of coded bits to transmit in a sub-frame is $N_{RE}$·M. This number may be adjusted based on waveform, reference symbols, control information, for example. But, without a loss of generality, it is assumed that this is the total number of coded bits. Based on the channel coding rate R, the proper submatrix size p may be found, such that $$\frac{K}{K+p} = R.$$

For the determined value of p, if $N_{RE}$·M≤(K+p)·Z, then all the coded bits may be generated by a single LDPC encoding operation. Here, the lifting value $Z_i$ may be selected such that (K+p)·$Z_i$ is close to $N_{RE}$·M. If (K+p)·$Z_i$ is larger than $N_{RE}$·M, then some puncturing operation may be applied. The puncturing may apply to either systematic bits or parity bits. If (K+p)·$Z_i$ is smaller than $N_{RE}$·M, then a zero-padding or repetition operation may be applied. Overall, no code block segments are needed.

If $N_{RE}$·M>(K+p)·Z, then the coded bits generated by multiple LDPC encoding operations. Let C denote the number of LDPC encoding operations to be executed, C, may be set $$= \left\lceil \frac{N_{RE} \cdot M}{(K+p) \cdot Z} \right\rceil.$$

Next, the coded block size for each LDPC encoding operation may be determined. One natural way is to select the LDPC coded block size to be identical for each segment. Hence, the lifting value $Z_i$ may be selected such that (K+p)·$Z_i$ is close to $$\frac{N_{RE} \cdot M}{C}.$$

If (K+p)·$Z_i$ is larger than $$\frac{N_{RE} \cdot M}{C},$$

then some puncturing operation may be applied. If (K+p)·$Z_i$ is smaller than $$\frac{N_{RE} \cdot M}{C},$$

then some zero-padding or repetition operation may be applied. It should be noted that the corresponding information block size is (K+p)·$Z_i$·R−$CRC_s$, where $CRC_s$ is the length of CRC used for each code-block segment. Hence, the TBS size may be C[(K+p)·$Z_i$·R−$CRC_s$]−$CRC_{tb}$, where $CRC_{tb}$ is the length of the CRC used for the entire transport block.

An alternative way is to select an LDPC coded block size that is not identical for each segment. To achieve a similar performance of the coding gain, the LDPC code block size for each segment should not differ much from each other. For example, two close-by lifting values $Z_i$ and $Z_j$ may be selected. $C_i$ and $C_j$ may be the number of segments encoded with the lifting value $Z_i$ and $Z_j$, respectively. The selection of $C_i$ and $C_j$ satisfies $C_i+C_j=C$ and $C_i(K+p)Z_i+C_j(K+p)·Z_j=N_{RE}M$. It should be noted that the information block sizes corresponding to the lifting values $Z_i$ and $Z_j$ are $(K+p)Z_i R-CRC$, and $(K+p)Z_j R-CRC$, respectively. Hence, the TBS size may be $C_i[(K+p) \cdot Z_i \cdot R - CRC_s] + C_j[(K+p) \cdot Z_j \cdot R - CRC_s] - CRC_{tb}$.

All above mentioned steps may be used to pre-compute multiple different parity check matrices of different sizes. These matrices may be saved in memory. As these matrices are sparse, a different method for memory management may be used.

To support HARQ-IR operations, some lower coding rate $R_{harq}$ than the coding rate R may be used. This lower coding rate implies that some sub-matrix of a certain protograph matrix is used for the LDPC code. For example, a sub-matrix may be composed of the first $p_{harq}$ rows and the first $p_{harq}+K$ columns from a protograph matrix $A_i$, for some $p \leq p_{harq} \leq P$, where p corresponds to the coding rate R. This sub-matrix may be precomputed and be saved in memory. All the statements above may apply to HARQ-IR operations by replacing p by $p_{harq}$.

$p_{harq}$ may be fixed as P. However, this leads to large memory usage to store the full version of the coded bits. Usually, the value $p_{harq}$ may be less than P, which may depend on the maximum retransmission count; initial coderate; or maximum number of redundancy versions supported by the system. This is a way to implement IR with limited buffer capabilities.

Figure 15:
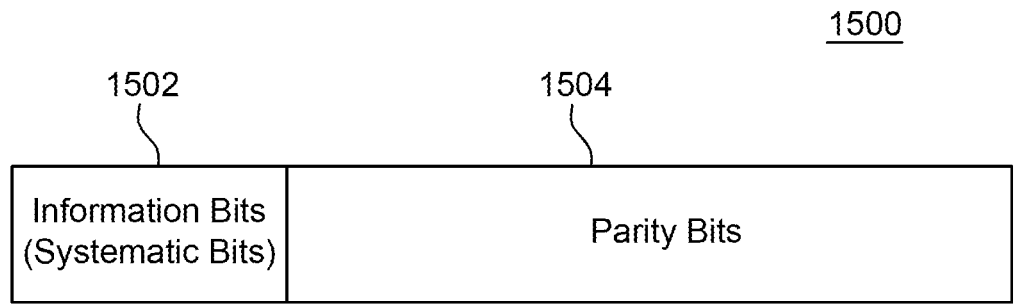
FIG. 15 illustrates structure of a code word produced based on a low density parity check code.

Suppose $p_{harq}$ is used for HARQ-IR operations, and the encoding of the lower coding rate $R_{harq}$ produces a codeword. If, for ease of illustration purposes, a systematic LDPC code is used, the structure of the codeword may be as shown in FIG. 15. FIG. 15 illustrates a codeword 1500 with information bits 1502 and parity bits 1504.

Based on the above stored entire codeword, RVs may be defined in different ways. In other words, the transmitted bits may be selected as a subset of the entire codeword, in different ways.

One way to define RV is to include Information/Systematic bits every time and select different transmitted parity bits. This may be a function of the lifting size used.

Figure 16:
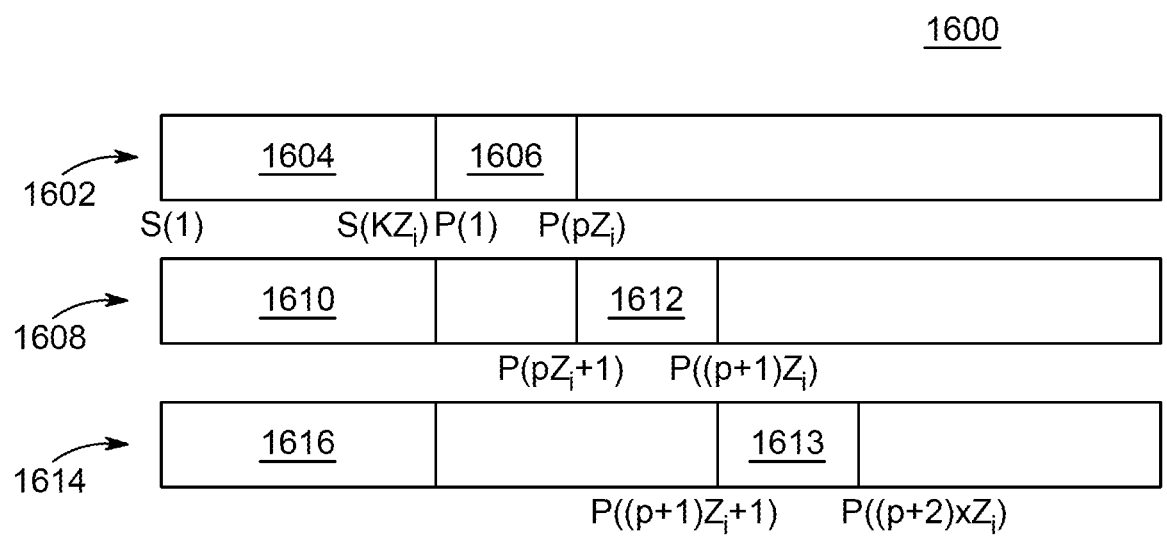
FIG. 16 illustrates a second re-transmission using different transmitted parity bits.

FIG. 16 illustrates a plurality of transmissions 1600. In a first transmission 1602 [Information bits 1604, 1 to $pZ_i$ parity bits 1606] are transmitted. In a first re-transmission 1608 [Information bits 1610, $pZ_i+1$ to $2pZ_i$ parity bits 1612] are transmitted. In a second re-transmission 1614 [Information bits 1616, $2pZ_i+1$ to $3pZ_i$ parity bits 1618] are transmitted.

Figure 17:
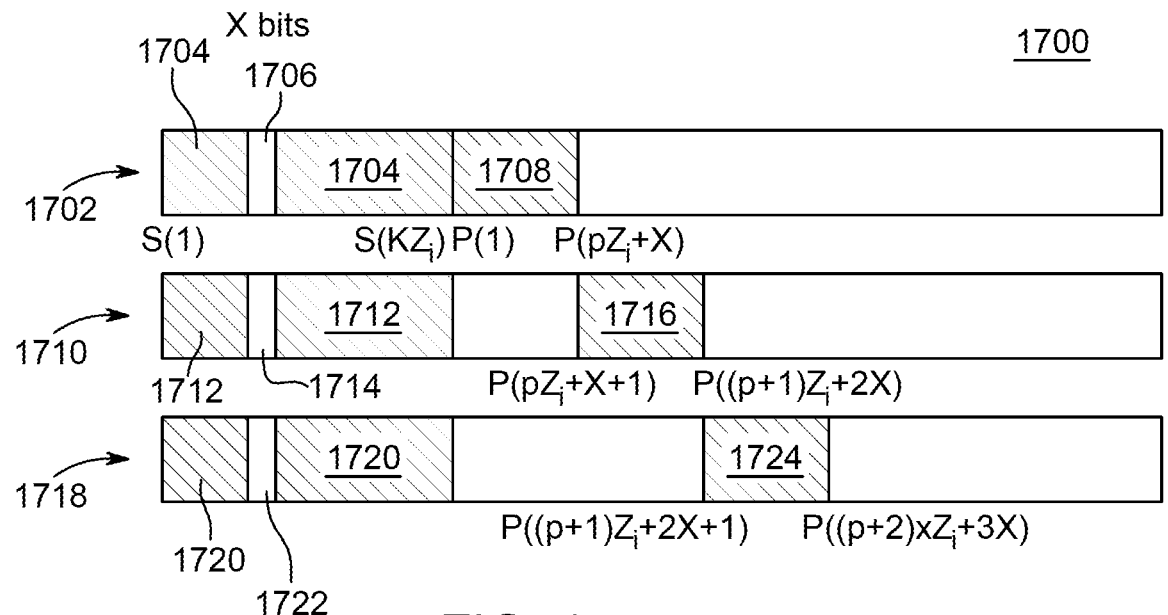
FIG. 17 illustrates retransmissions in which different transmitted parity bits are selected.

FIG. 17 illustrates a method for sending systematic bits multiple times 1700, thus increasing received SNR and hence the confidence of the systematic bits. Another way to define RV is to include Information/Systematic bits every time with some systematic bits punctured, while selecting different the parity bits transmitted. This may be function of the lifting size used. For example, in first transmission 1702 [Information bits 1704 with X bits 1706 punctured, 1 to $pZ_i+X$ parity bits 1708] are transmitted. In a first re-transmission 1710 [Information bits 1712 with X bits 1714 punctured, $pZ_i+X+1$ to $2pZ_i+2X$ parity bits 1716] are transmitted. In a second re-transmission 1718 [Information bits 1720 with X bits 1722 punctured, $2pZ_i+2X+1$ to $3pZ_i+3X$ parity bits 1724] are transmitted. This is one exemplary way to define a RV scheme.

Figure 18:
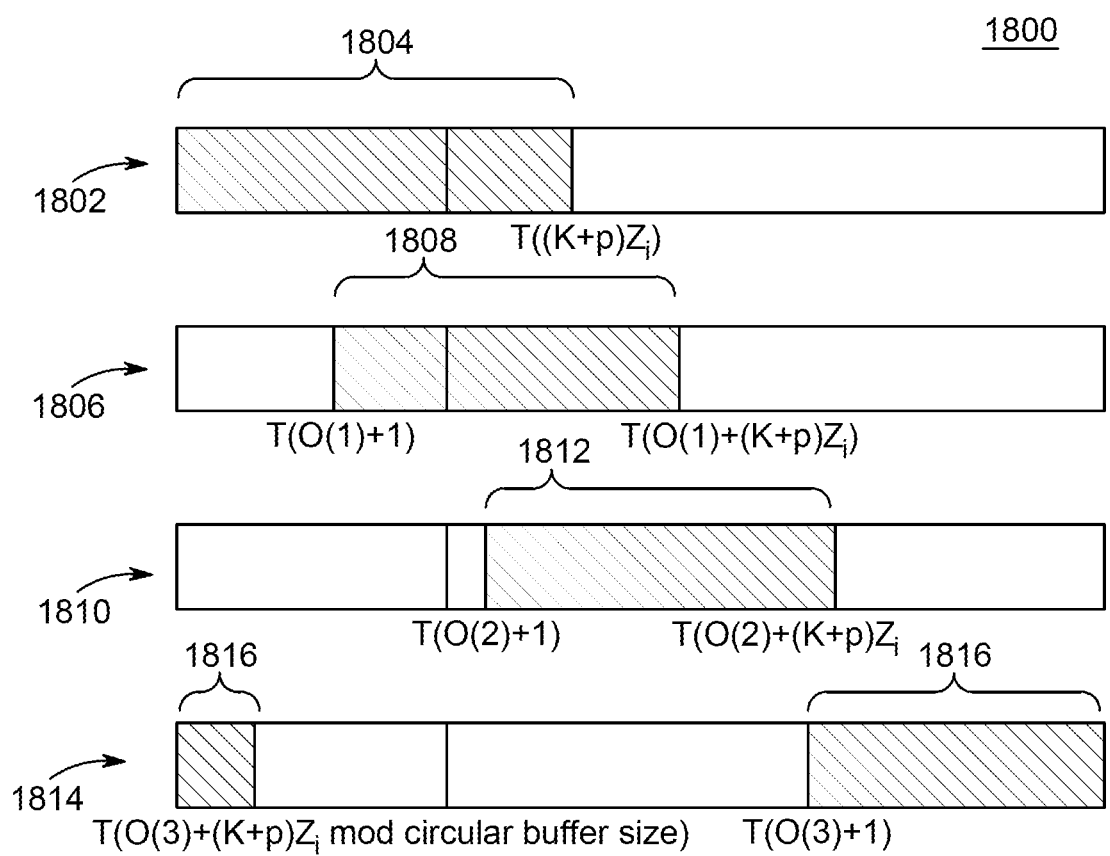
FIG. 18 illustrates different retransmissions in which a different starting point is used in a coded block.

FIG. 18 illustrates a method 1800 for using a different starting point from the coded block. In a first transmission 1802 [1, ..., $(p+K)Z_i$] bits 1804 are transmitted. In a first re-transmission 1806 [O(1)+1, ..., O(1)+(K+p)Z_i] bits 1808 are transmitted. In a second re-transmission 1810 [O(2)+1, ..., O(2)+(K+p)Z_i] bits 1812 are transmitted. In a third re-transmission 1814 [O(3)+1, ..., O(3)+(K+p)Z_i mod buff size] bits 1816 are transmitted. O(1), O(2), ... represent the offsets for each re-transmission. The offsets may be a function of the lifting value $Z_i$ and redundancy version identifier (RVid), or the like. It should be noted that a circular buffer may be applied here.

Figure 19:
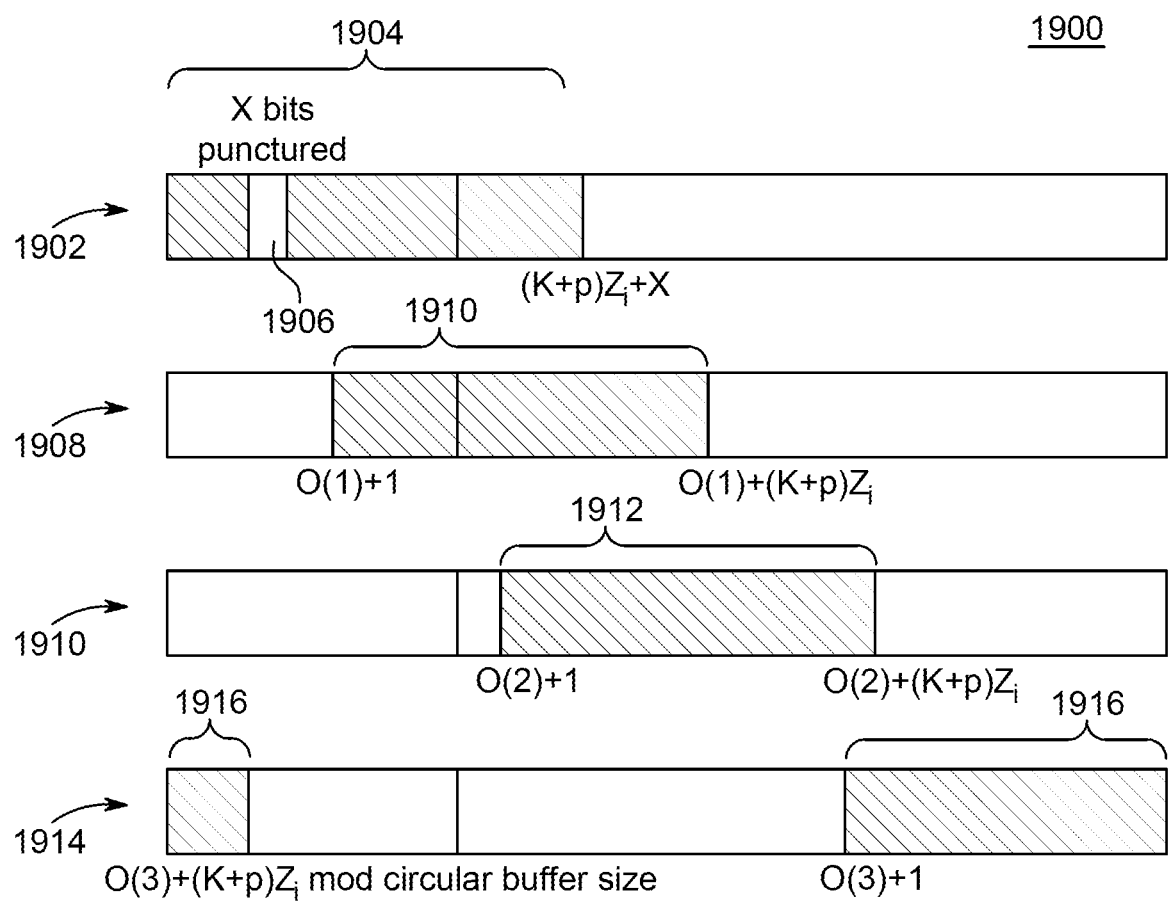
FIG. 19 illustrates different retransmission in which a different starting point from the coded block is used with some systematic bits punctured.

FIG. 19 illustrates a method 1900 for using a different starting point from the coded block with some systematic bits punctured. In first transmission 1902 [1, ..., (p+K)$Z_i$+X] bits 1904 with X systematic bits 1906 punctured are transmitted. In a first re-transmission 1908 [O(1)+1, ..., O(1)+(K+p)$Z_i$] bits 1910 are transmitted. In a second re-transmission 1910 [O(2)+1, ..., O(2)+(K+p)$Z_i$] bits 1912 are transmitted. In a third re-transmission 1914 [O(3)+1, ..., O(3)+(K+p)$Z_i$ mod buff size] bits are transmitted. O(1), O(2), represent the offset for each re-transmission. The offsets may be a function of lifting value $Z_i$ and RVid, or the like. A circular buffer may be applicable here as well.

These coded bits are then interleaved/modulated. At the transmitter, HARQ-IR operations may be similar to those of an LTE/LTE-A turbo-encoder. However, the receiver process is different.

Unlike turbo codes used in LTE systems, where the mother code rate is fixed to 1/3, the disclosed method for LDPC codes is flexible with respect to the mother code rate. For example, the mother code rate may have a range of 1/5 to 8/9. This mother code rate may depend on the data QoS (e.g., throughput, latency requirements), channel conditions, ACK/NACK statistics, and actual coding rates etc. It is possible that at low coding rates, the Chase Combining has a good performance, and hence, lower coding rates are not needed. At high coding rates, the Incremental Redundancy has good performance, and hence, the mother code rate may need to be made lower.

The transmitter may pass the mother code rate to the receiver, and may adjust the mother code rate periodically or a mother code rate adjustment may be event triggered. It should be noted that the mother code rate can be described by the value of $p_{harq}$, as the resulting coding rate is $$\frac{K}{K+p_{harq}}.$$

This value of $p_{harq}$ may be sent from eNB to a WTRU in a DCI information transmission. In the uplink direction, the value of $p_{harq}$ may be sent from a WTRU to an eNB in UCI information. Also, the lifting size $Z_i$ may be another parameter to be synchronized between transmitter and receiver.

Figure 20:
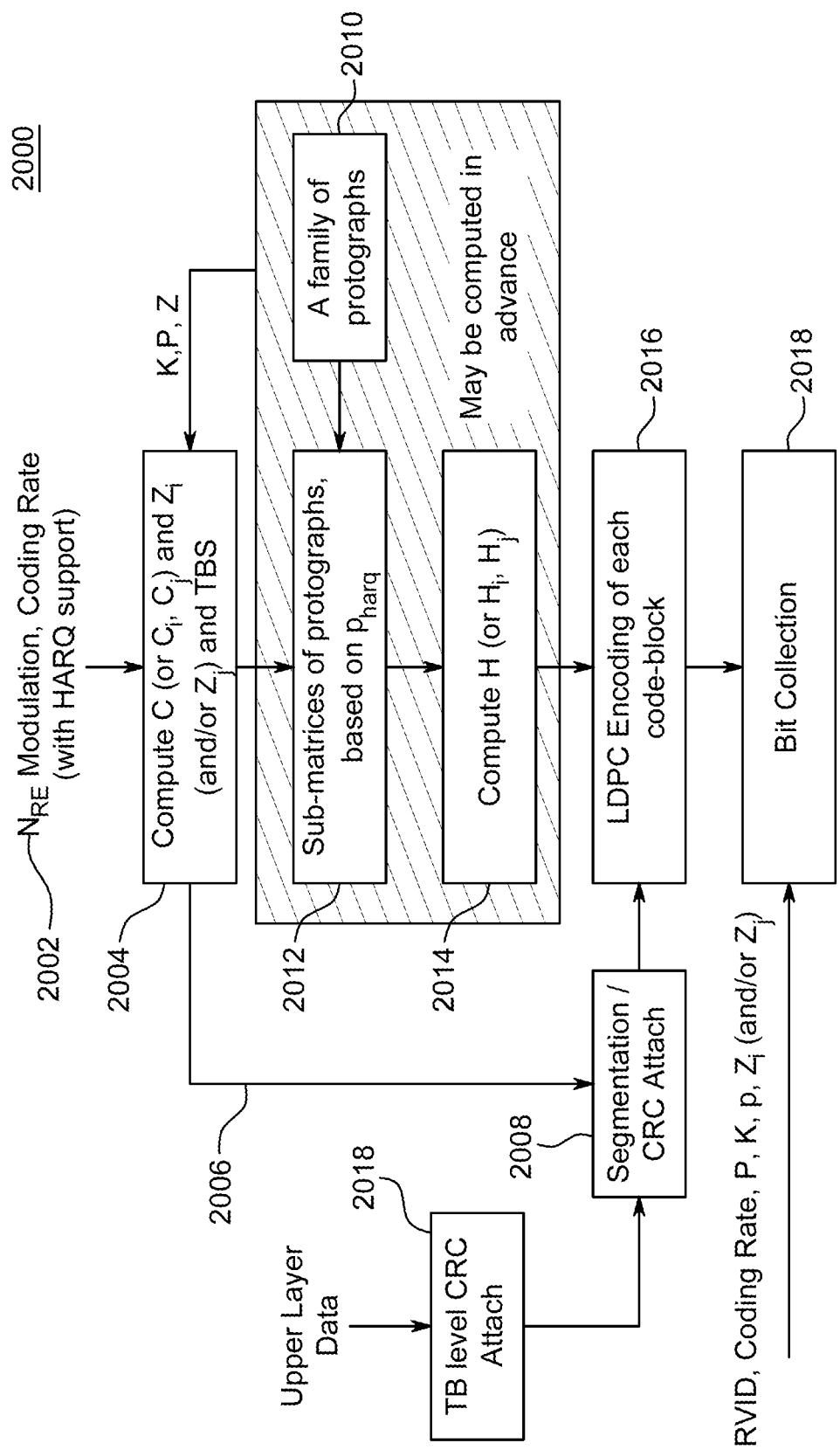
FIG. 20 illustrates the low density parity check encoding processing with hybrid automatic repeat request support.

FIG. 20 illustrates an LDPC encoding process with HARQ support 2000. A number of resource elements or a transport block size may be determined 2002 along with an applicable modulation and coding rate. The number of LDPC encoding operations C and the lifting size $Z_i$ may further be determined 2004. The determined transport block size may be designated 2006 for use in segmentation and CRC attachment 2008 and may be used in calculating $Z_i$. From a family of protographs 2010, submatrices of protographs may be determined 2012, based on the mother code rate $p_{harq}$. Final parity check matrices H may be computed 2014 for use in encoding 2016.

Upon receiving a TB with an attached CRC 2018, the TB is segmented 2008 and passed to an LDPC encoder 2016 for encoding. Bit selection 2018 may be performed in accordance with FIGS. 14-19 or as in any method disclosed herein.

Figure 21:
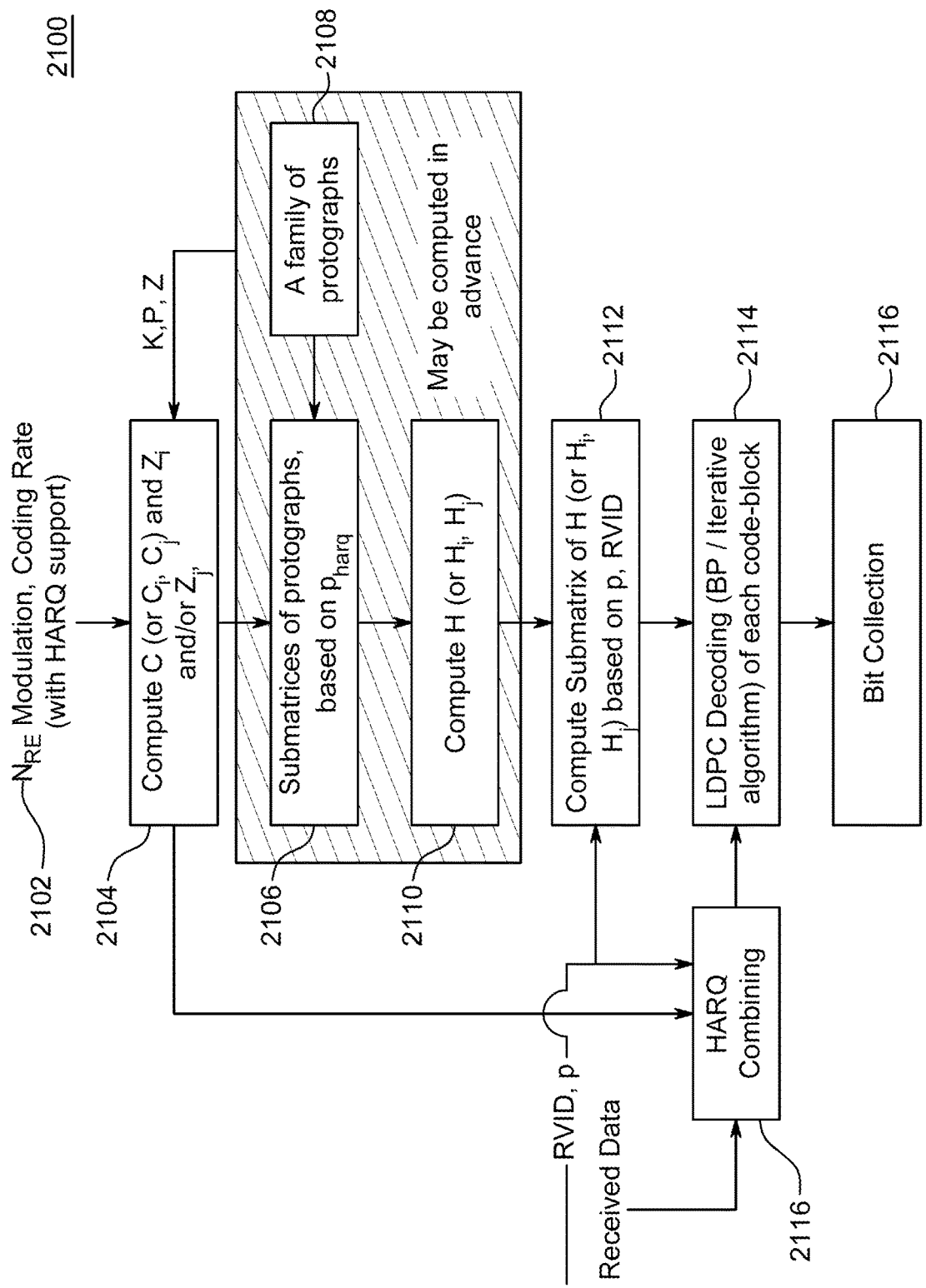
FIG. 21 illustrates the low density parity check decoding process with hybrid automatic repeat request support.

FIG. 21 illustrates an LDPC decoding process 2100. At the receiver, parameters 2102 including a number of allocated RE; modulation index; coding rate R or parity length p may be used to calculate 2104 $Z_i$ (and/or $Z_j$) and C. Based on submatrices of protographs based on $p_{harq}$ 2106 and a family of protographs 2108, the parity check matrices H may be computed 2110. Code-block segments are received from demodulator/deinterleaver. For the first RV, the initial submatrices of H are generated 2112. These are much smaller parity matrices than those used at transmitter as these are using only few parity bits. If the decoding for the first RV is not successful, the received data is saved in a HARQ buffer. Each additionally received RV is combined with the previous RV's, which was stored in HARQ buffer, before sending to the LDPC decoder 2114. This results in higher number of parity bits, which results in larger parity check matrices. Hence, for each additionally received RV, the parity check matrices are augmented with the corresponding number of rows and columns. The resulting parity check matrices are for incrementally reduced coding rates.

Code-block segments are decoded without de-puncturing with a parity check matrix. If any code-block segment had repetition (to accommodate the last few bits of segments) they are combined appropriately. Min-sum/sum-product/any belief propagation iterative algorithm may be used here. In case of decoding error, the newly received RV is stored in HARQ buffer. If CRC is attached in each code-block, it may be used to perform early detection and stopping of the decoded code-block segment. Once all the code-block segments are decoded successfully, they may be combined together and bit collected 2116 to create the received transport-block to send to upper layers.

Figure 22:
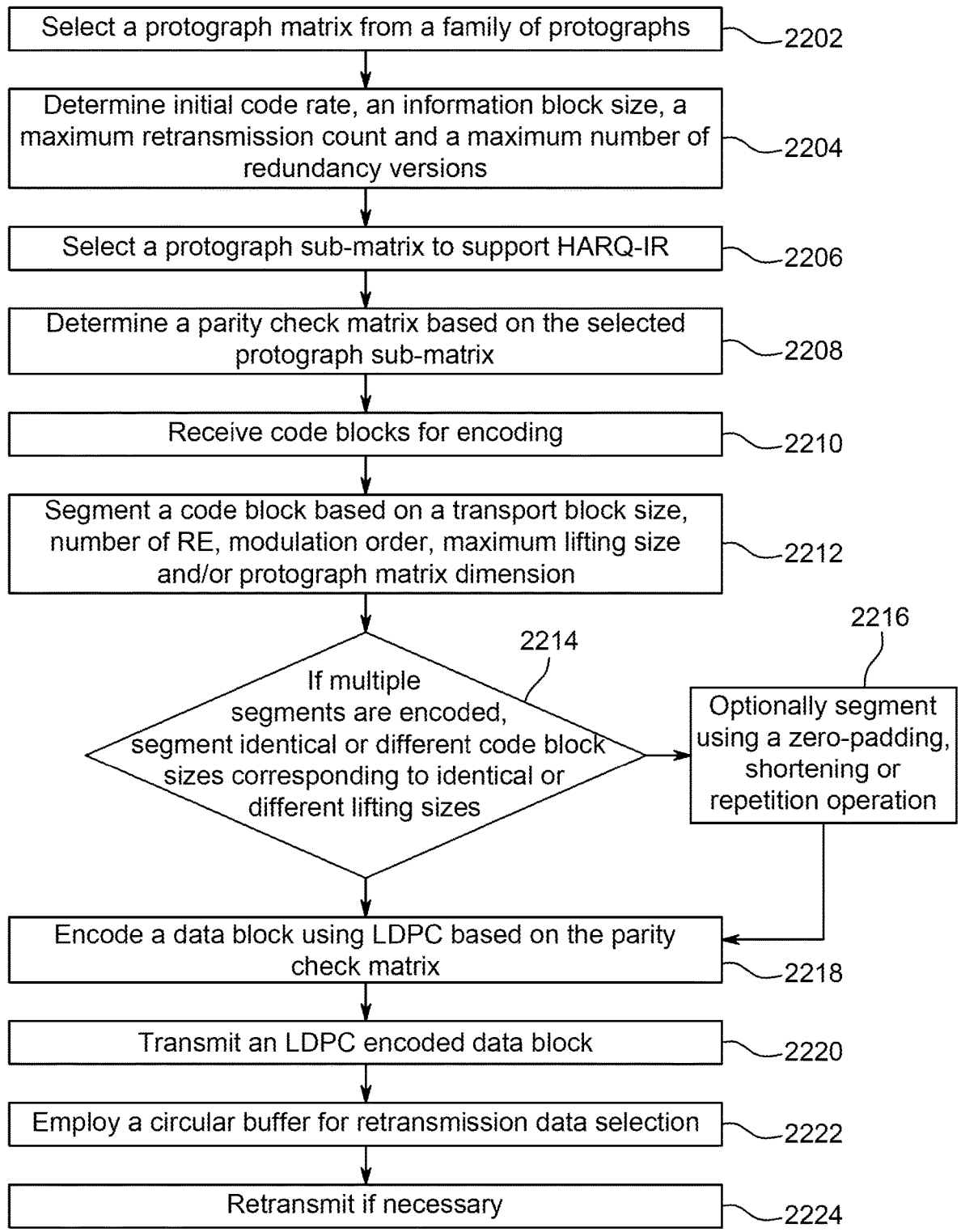
FIG. 22 illustrates a method for transmitting data using LDPC and HARQ-IR.

FIG. 22 is a flowchart which illustrates a method 2200 for transmitting data using LDPC and HARQ-IR. The method comprises selecting a protograph matrix from a family of protographs 2202. An initial code rate, information block size, a maximum retransmission count and a maximum number of redundancy versions may be determined 2204. A protograph sub-matrix may be selected to support HARQ-IR, based on one or more of the initial code rate, information block size, maximum retransmission count and maximum number of redundancy versions 2206. By supporting HARQ-IR, the protograph sub-matrix may be either an initial protograph sub-matrix for a first transmission or a subsequent protograph sub-matrix which includes redundant information from a first or previous transmission. A parity check matrix may then be determined based on the selected protograph sub-matrix 2208. Code blocks may be received for encoding by higher layers 2210. The code blocks may be segmented for encoding 2212. In an embodiment, segmenting a code block may be based on a transport block size, a number of RE, a modulation order, a maximum lifting size and a protograph matrix dimension. If multiple segments are encoded 2214, segmenting identical or different code block sizes, corresponding to identical or different lifting size may be performed. Segmenting may further comprise using at least one of zero-padding, shortening or repetition operations 2216. A data block may be encoded using LDPC, based on the parity check matrix which is based on a lifting size determined based on a number of RE, a modulation order, a coding rate and a protograph matrix dimension 2218. The encoding may further comprise using a bit selection scheme for transmission, including at least one of a circular buffer for retransmission data selection, with or without systematic bits puncturing. Finally, the LDPC encoded data block may be transmitted 2220. In the case of a retransmission, a circular buffer may be employed for data selection 2222. The selected data may then be retransmitted 2224.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed:

1. A method comprising: transmitting a first signal comprising first low density parity check (LDPC) bits, wherein the first LDPC bits include systematic bits and parity bits;
receiving information indicating that the first signal was incorrectly received;
and transmitting a second signal comprising second LDPC bits, in response to the information indicating that the first signal was incorrectly received, wherein the second signal includes LDPC bits according to a lifting size of an LDPC base graph.

2. The method of claim 1, wherein the second LDPC bits include other systematic bits and other parity bits.

3. The method of claim 2, wherein the systematic bits and the parity bits are combined with the other systematic bits and the other parity bits.

4. The method of claim 1, wherein the second LDPC bits include at least some of the first LDPC bits.

5. The method of claim 1, wherein the first LDPC bits are encoded based on the LDPC base graph.

6. The method of claim 1, wherein the first signal includes LDPC bits according to the lifting size of the LDPC base graph.

7. The method of claim 1, wherein the method is performed by a user equipment (UE).

8. The method of claim 1, wherein the method is performed by a base station.

9. A wireless transmit/receive unit (WTRU) comprising:
a transmitter configured to transmit a first signal comprising first low density parity check (LDPC) bits, wherein the first LDPC bits include systematic bits and parity bits;
a receiver configured to receive information indicating that the first signal was incorrectly received; and
the transmitter configured to transmit a second signal comprising second LDPC bits, in response to the information indicating that the first signal was incorrectly received, wherein the second signal includes LDPC bits according to a lifting size of an LDPC base graph.

10. The WTRU of claim 9, wherein the second LDPC bits include other systematic bits and other parity bits.

11. The WTRU of claim 10, wherein the systematic bits and the parity bits are combined with the other systematic bits and other parity bits.

12. The WTRU of claim 9, wherein the second LDPC bits include at least some of the first LDPC bits.

13. The WTRU of claim 9, wherein the first LDPC bits are encoded based on the LDPC base graph.

14. The WTRU of claim 9, wherein the first signal includes LDPC bits according to the lifting size of the LDPC base graph.

15. The WTRU of claim 9, wherein the WTRU is a user equipment (UE).

16. The WTRU of claim 9, wherein the WTRU is a base station.

17. A wireless transmit/receive unit (WTRU) comprising:
a transmitter configured to transmit a first signal comprising first low density parity check (LDPC) bits, wherein the first LDPC bits include first systematic bits and first parity bits;
a receiver configured to receive information indicating that the first signal was incorrectly received; and
the transmitter configured to transmit a second signal comprising second LDPC bits, wherein the second LDPC bits include second systematic bits and second parity bits, in response to the information indicating that the first signal was incorrectly received, wherein the LDPC bits of the second signal are in accordance with a lifting size of an LDPC base graph; and wherein the first signal and the second signal are combinable.

18. The WTRU of claim 17, further comprising: the receiver configured to receive information indicating successful data reception, based on a combination of the first signal and the second signal.

19. The WTRU of claim 17, wherein the second LDPC bits include at least some of the first LDPC bits.

20. The WTRU of claim 17, wherein the second LDPC bits include none of the first LDPC bits.

21. The WTRU of claim 17, wherein the first signal and the second signal are combined via incremental redundancy.

22. The WTRU of claim 17, wherein the WTRU is a user equipment (UE).

23. The WTRU of claim 17, wherein the WTRU is a base station.

* * * * *